United States Patent [19]
Leksell et al.

[11] Patent Number: 6,079,353
[45] Date of Patent: Jun. 27, 2000

[54] CHAMBER FOR REDUCING CONTAMINATION DURING CHEMICAL VAPOR DEPOSITION

[75] Inventors: David Leksell, Aptos; Ming Xi Chan, Milpitas; Joseph P. Ellul, San Jose; Jeanne L. Luce, Fremont; David T. Ryan, Concord; Iqbal A. Shareef, Campbell; Chung J. Lee, Fremont; Giovanni Antonio Foggiato, Morgan Hill, all of Calif.

[73] Assignee: Quester Technology, Inc., Fremont, Calif.

[21] Appl. No.: 09/050,228

[22] Filed: Mar. 28, 1998

[51] Int. Cl.$^7$ .................................................... C23C 16/00
[52] U.S. Cl. ............................................ 118/715; 156/345
[58] Field of Search ............................ 118/715; 156/345; 422/158

[56] References Cited

U.S. PATENT DOCUMENTS

| | | | |
|---|---|---|---|
| 4,950,376 | 8/1990 | Hayashi et al. | 204/298.32 |
| 5,595,602 | 1/1997 | Harlan | 118/715 |

FOREIGN PATENT DOCUMENTS

| | | | |
|---|---|---|---|
| 62-93922 | 4/1987 | Japan | 118/715 |

*Primary Examiner*—Thi Dang
*Assistant Examiner*—Erin Fieler
*Attorney, Agent, or Firm*—Fliesler Dubb Meyer & Lovejoy LLP

[57] ABSTRACT

This invention relates to the design of apparatus for processing electronic devices, including equipment for chemical vapor deposition. The new designs of gas separator plates, their configuration, and the regulation of gas flows through the system provides control over the pattern of precursor gas flow away from the separation plates, thereby decreasing the amount of byproducts that are deposited on the plates and throughout the reactor. New designs for shaping other surfaces of the dispersion head reduces contamination of those elements, and new designs for chamber panels decrease the deposition of byproducts on those surfaces, as well as other elements of the reactor. Decreasing deposition of byproducts increases the amount of thin film, and the quality of the film which can be deposited without requiring the system to be shut down. This increases the throughput of products in the deposition process, thereby increasing the efficiency of electronic device manufacture and lowering the cost.

29 Claims, 23 Drawing Sheets

FIG.—1 PRIOR ART

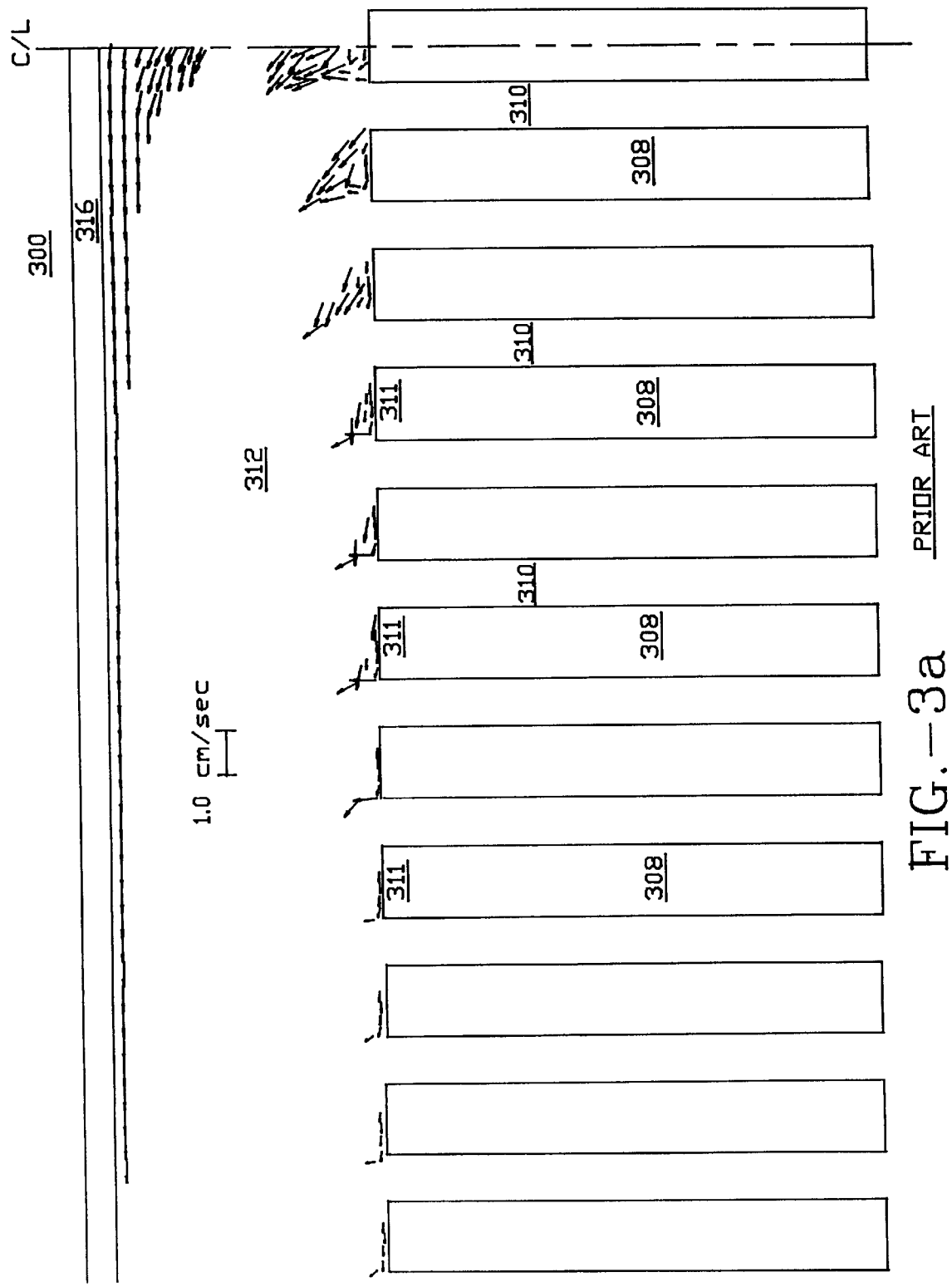

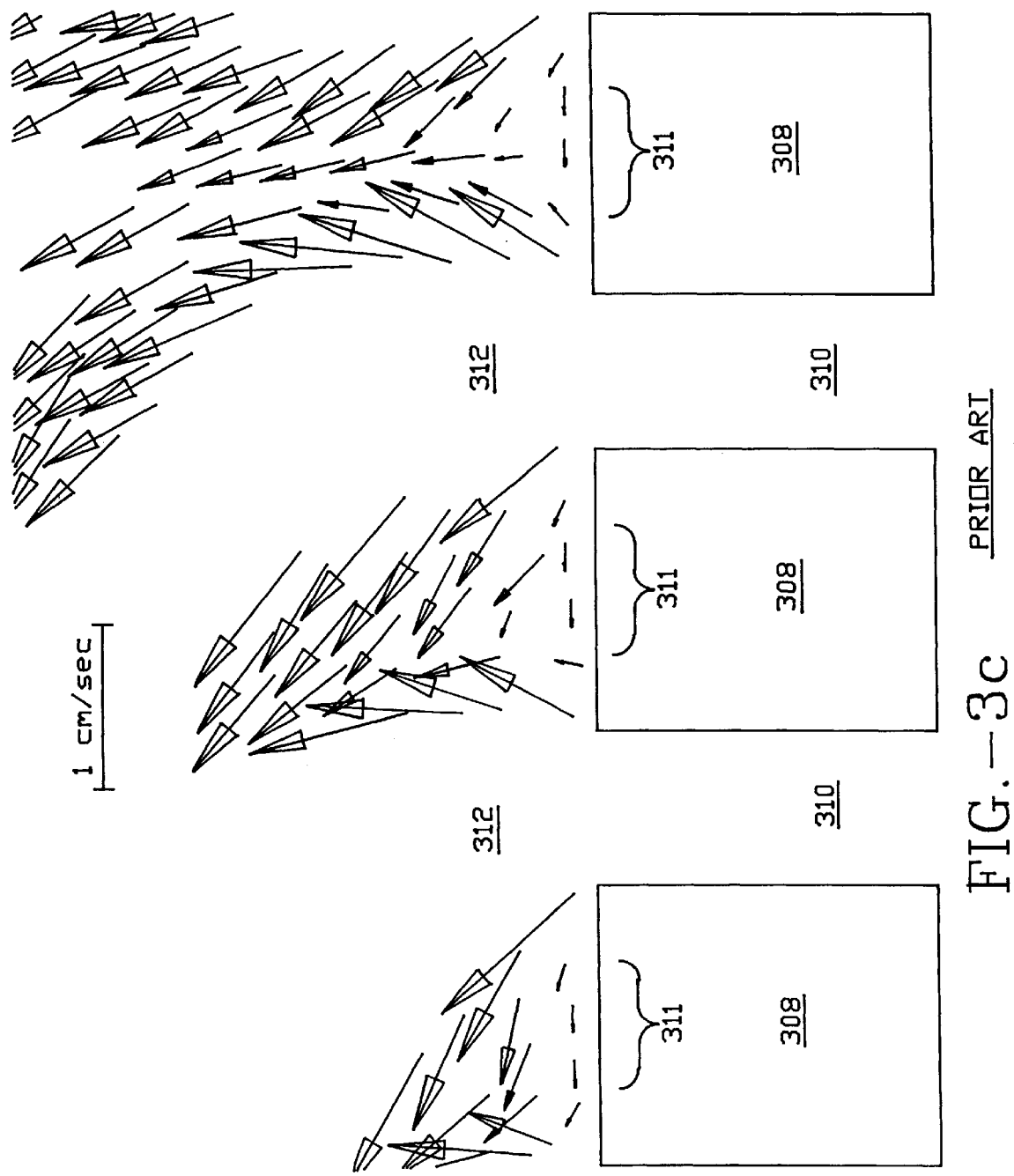
FIG.—3c  PRIOR ART

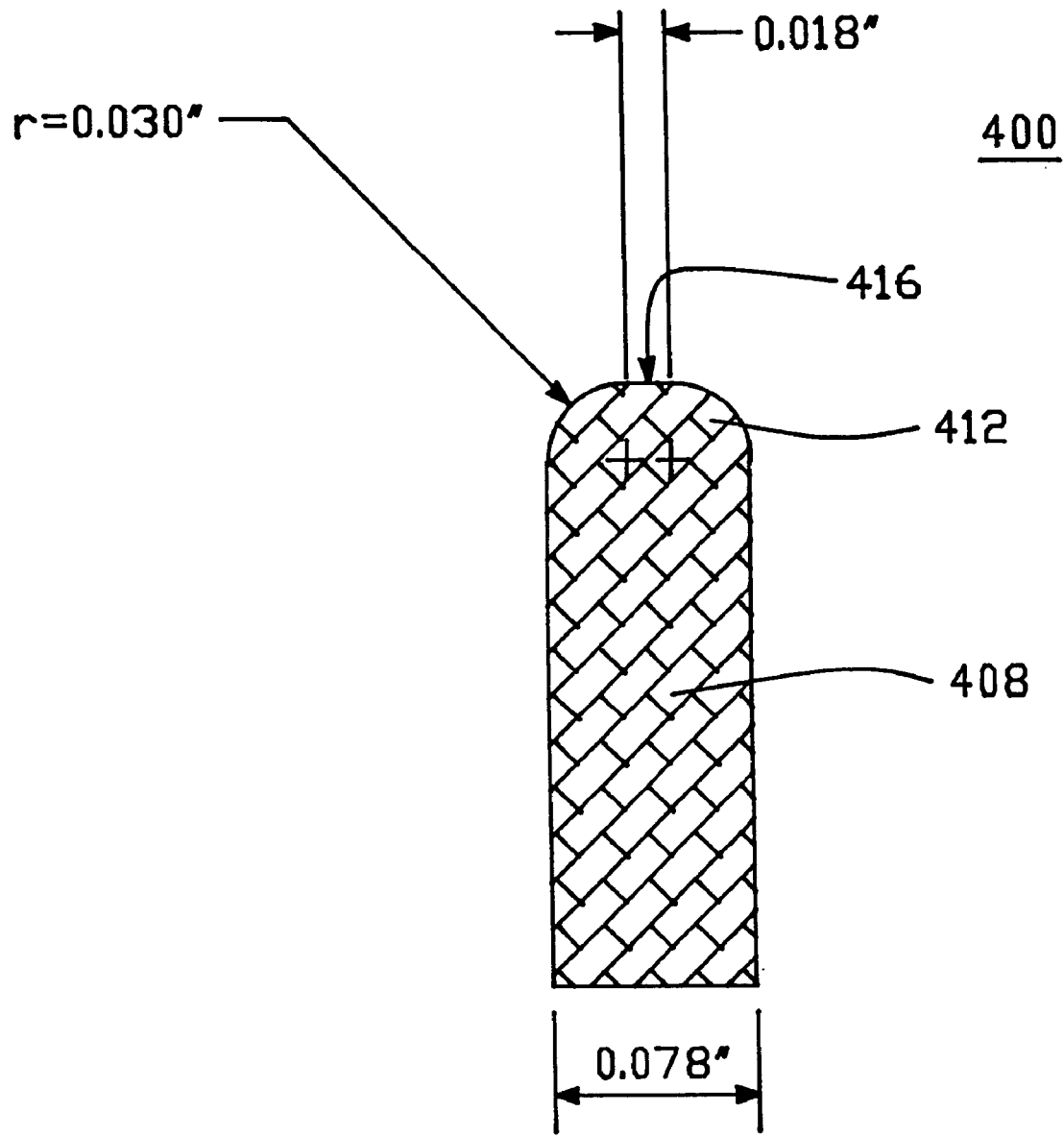
FIG.—4a

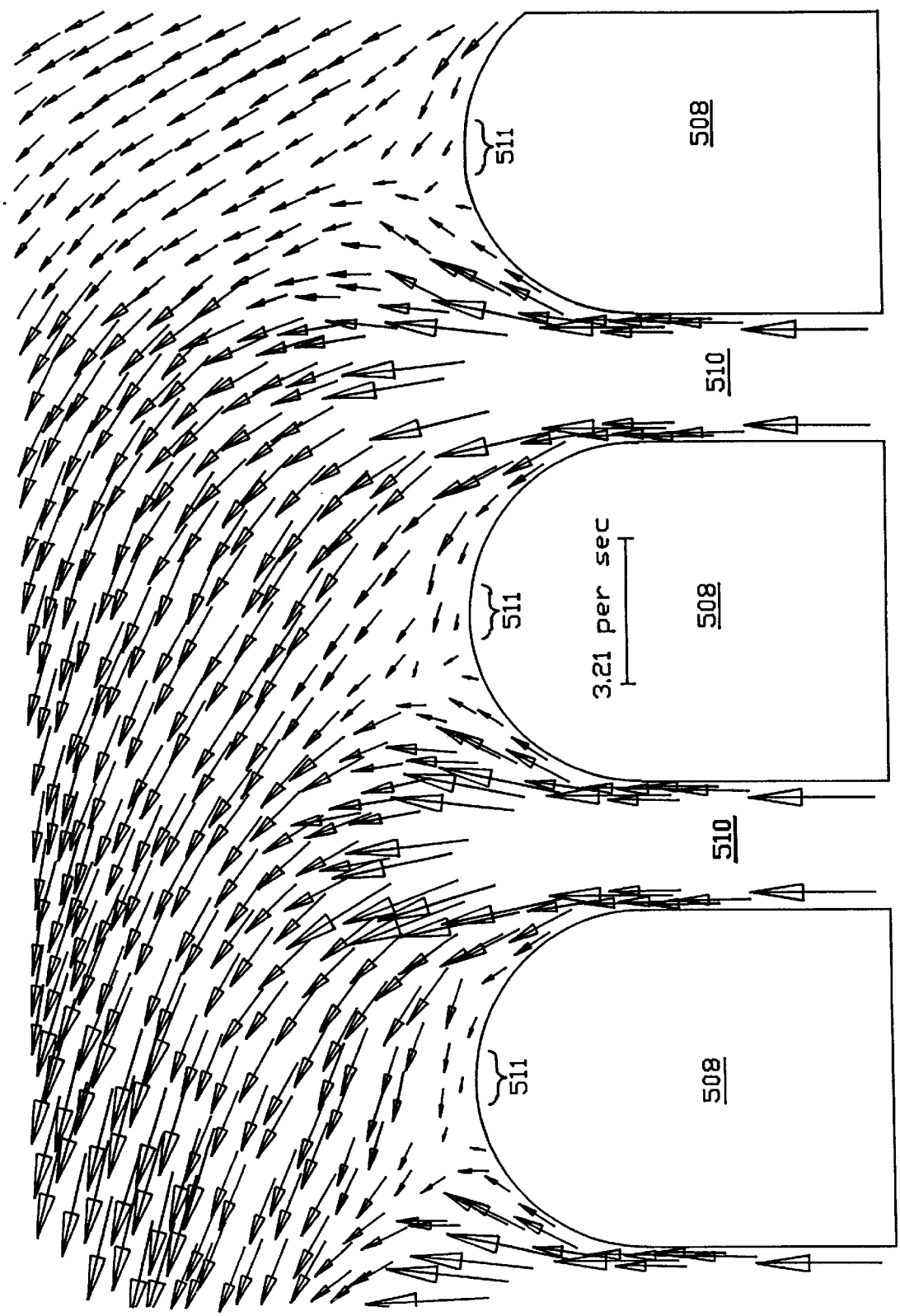

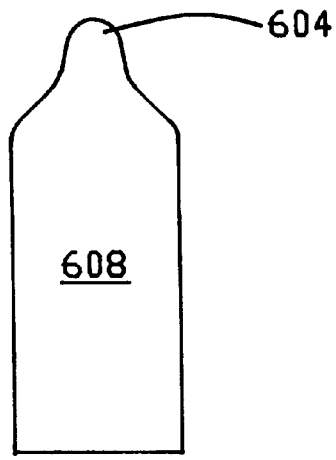
FIG.—6a
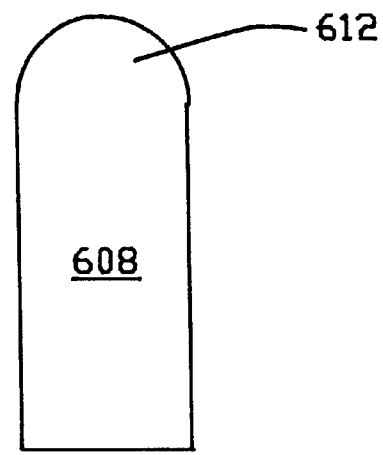
FIG.—6b
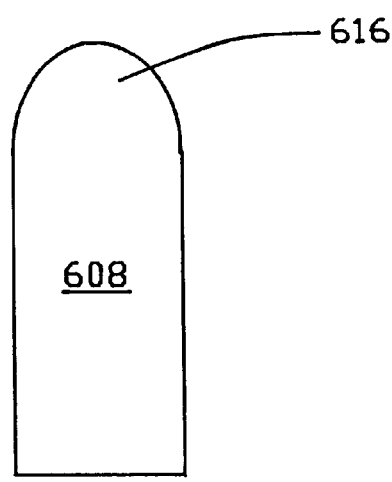
FIG.—6c
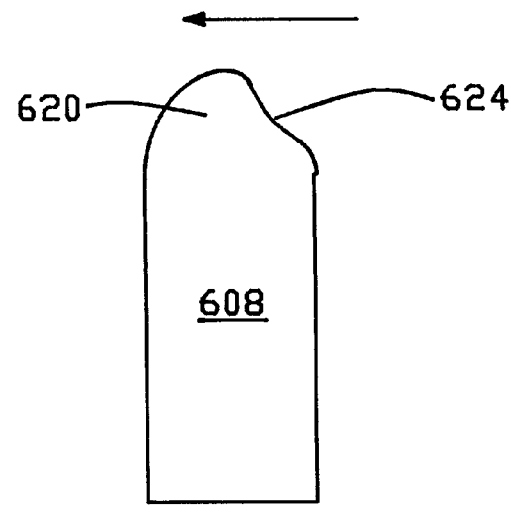
FIG.—6d

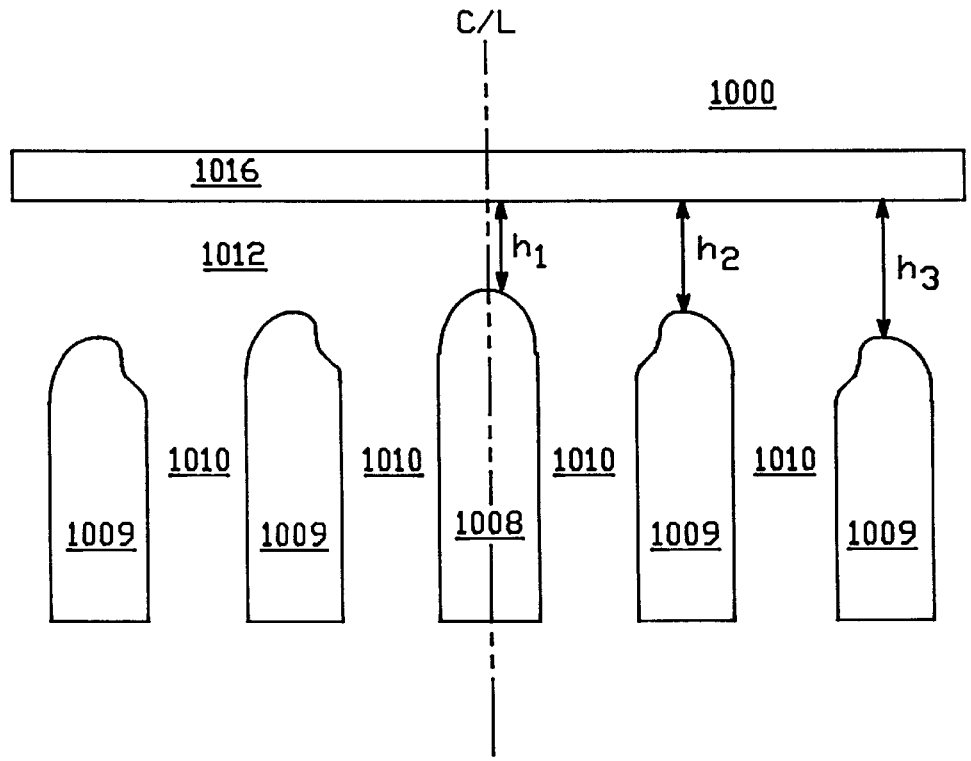
FIG.—10a
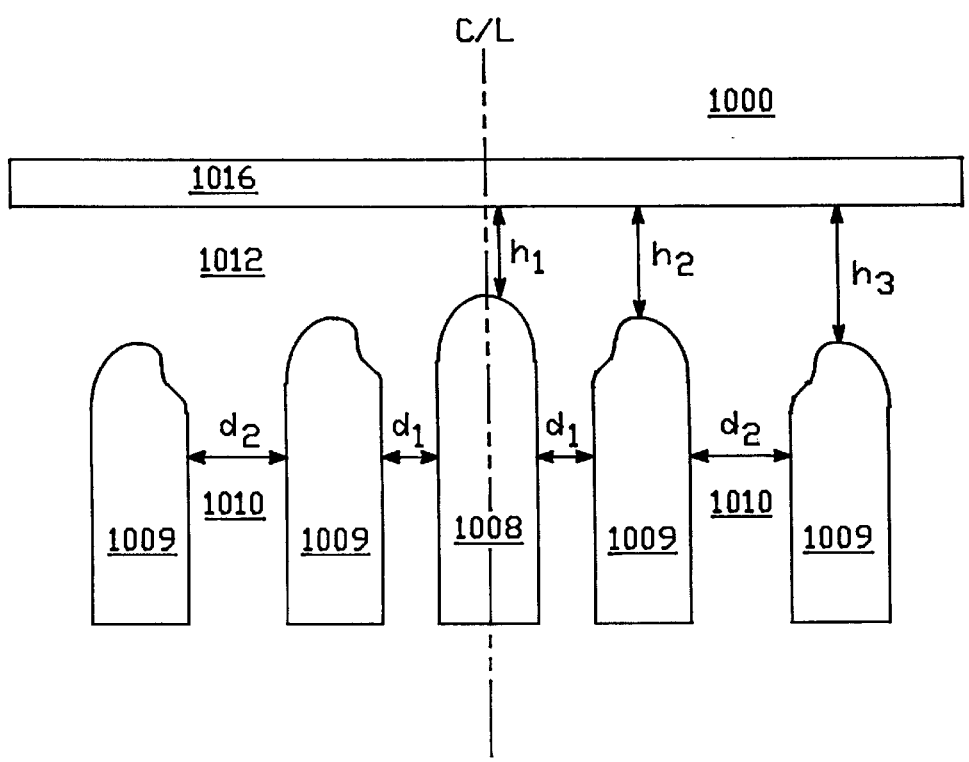
FIG.—10b

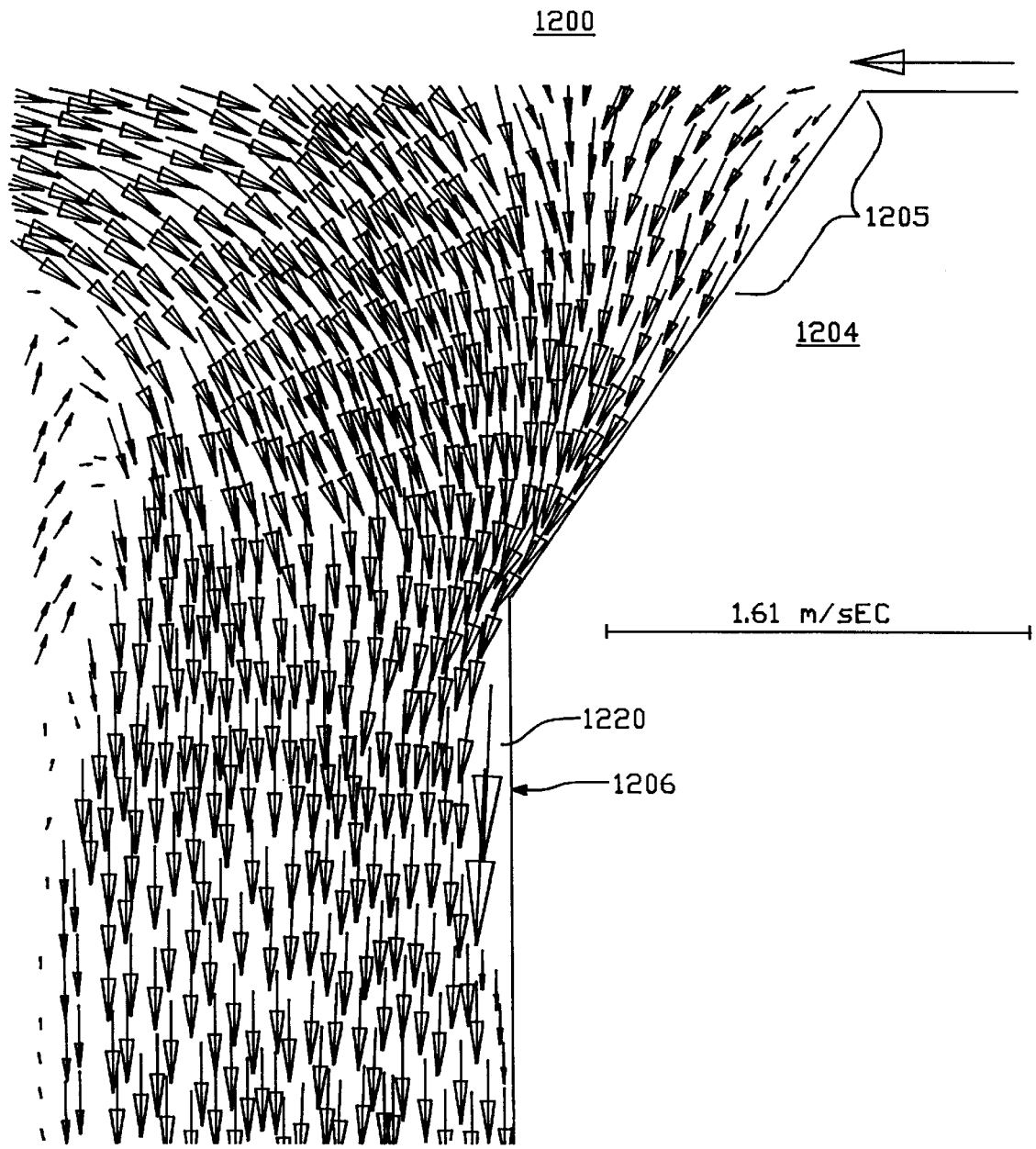
FIG.—12a  PRIOR ART

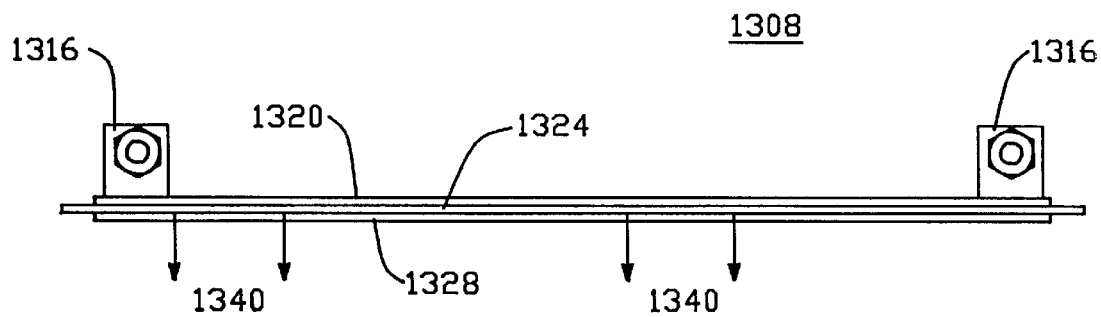
FIG.-13b
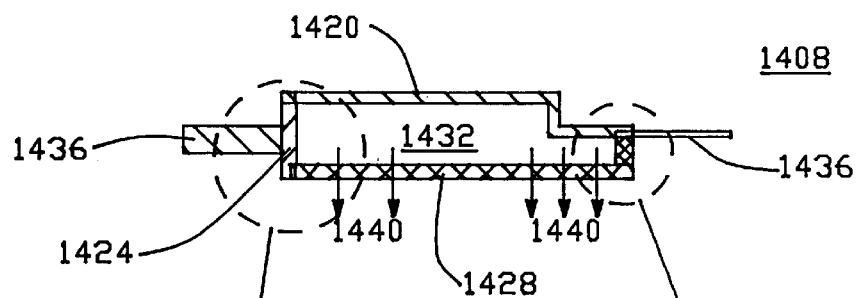
FIG.-14a
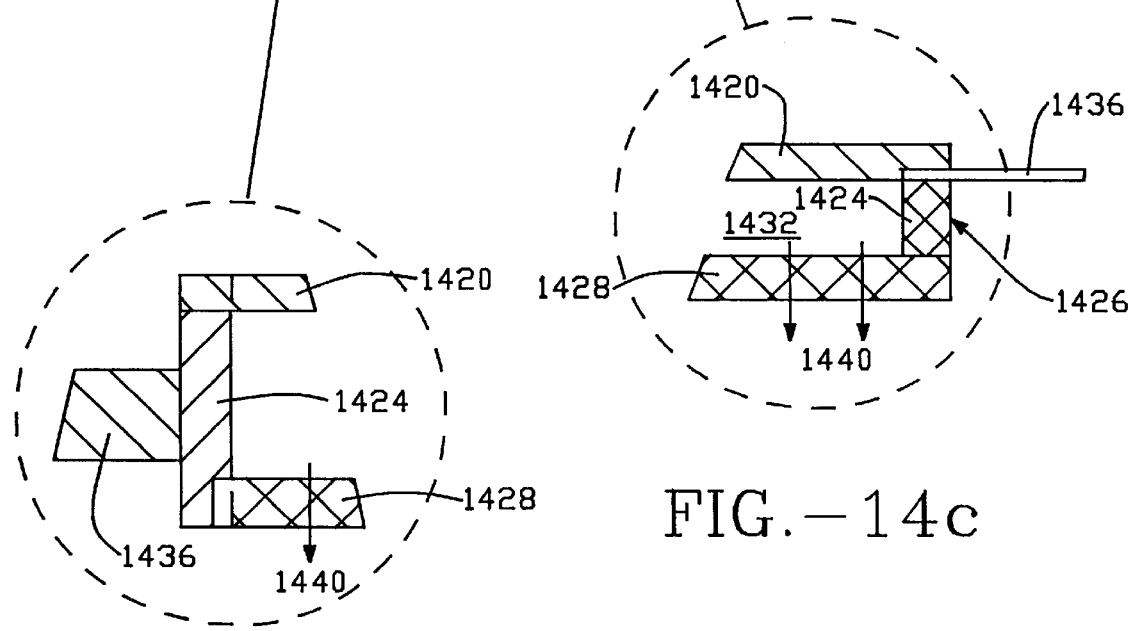
FIG.-14b
FIG.-14c

CHAMBER FOR REDUCING CONTAMINATION DURING CHEMICAL VAPOR DEPOSITION

BACKGROUND OF THE INVENTION

I. Field of the Invention

The present invention relates to the manufacture of semiconductor devices, specifically to the deposition of dielectric thin film layers using chemical vapor deposition (CVD) or transport polymerization (TP) methods. More specifically, the invention relates to the control of deposition of by-products on the interior surfaces of semiconductor manufacturing equipment.

II. Discussion of the Related Art

Integrated circuits in general are made by the stacking and patterning of thin film layers of material in and on a substrate. Such layers can be made using CVD or TP. During CVD and TP, precursors of the thin films are processed to form reactive intermediate species that are transported into a deposition chamber. Upon making contact with a surface, these reactive intermediates adhere to the semiconductor substrate surface and polymerize with each other, forming the layer of thin film. However, as these layers are applied to the semiconductor substrate surface, they also adhere to the mechanisms used to hold the substrate and the equipment used to apply the material surrounding the substrate. This unwanted contamination of the deposition equipment must be removed periodically, and during the removal process, that the equipment be shut down. Therefore, there is loss of productive time available for deposition of thin film layers resulting in decreased throughput and increased costs of manufacturing.

Many different surfaces in the deposition chamber are affected by byproduct deposition. They include the reactants dispersion head and the interior paneling of the deposition chamber.

A. Byproduct Buildup on Surfaces of the Dispersion Head

FIG. 1 is a depiction of a prior art dispersion head device 100 with gas separator plates 104, cooling plates 108, with beveled or chamfered top sides 112, and gas injection plate 116 with a flat top surface 120. Gases containing precursors for semiconductor thin films are fed into the dispersion head through the gas injector plate 116, are distributed between gas separator plates 104 and thereafter exit through the top of the dispersion head. A chuck and semiconductor substrate (not shown) are placed over the dispersion head, where the layer of semiconductor thin film is deposited.

FIG. 2 schematically depicts elements of a prior art deposition chamber 200 of an atmospheric pressure chemical vapor deposition system with prior art dispersion head 204 and gas separation plates 208. Precursor gases are mixed in the dispersion head 204 and pass through the passageways 210 between gas separator plates 208 and thereafter flow laterally in a space 212 toward a wafer 216, which is held on a susceptor 220 maintained at elevated temperature by a heater 224. As the gases arrive at the surface of the wafer, they react with the substrate of the wafer to form a thin film bonded to the wafer surface. After passing the wafer 216, the gases are exhausted through an exhaust port 228.

One of the critical variables affecting the thickness and uniformity of this thin film is the distance between the top of the dispersion head and the wafer surface. If the dispersion head is too far away from the wafer, the rate of deposition is too low, and if the dispersion head is too close to the wafer, the resulting film has poor uniformity.

Moreover, by way of example only, when growing $SiO_2$, some of the gases react away from the wafer surface to form a white powdery byproduct. Similarly, when other materials are deposited, byproducts can form away from wafer surfaces. The powdery byproduct can deposit on any surface exposed to the precursor gases which have low gas flow rates over their surfaces. The low gas flow rates increases the residence time of the precursors at the surfaces of the apparatus. By way of example only, one of the places this product collects is on the top horizontal surface of the gas separator plates 208. As the byproduct builds up on the top surface of these prior art plates, the distance between the effective top of the plates and the wafer decreases. This decrease in separation distance causes wafer film thickness non-uniformity. Therefore, the surfaces of the prior art gas separator plates must be cleaned often, leading to decreased service time, inefficiency of manufacture, and increased costs.

FIG. 3a shows elements of a prior art dispersion head and wafer 300. An array of gas separator plates 308 comprises a series of evenly spaced plates, defining a series of gas flow channels 310 there between. The tops of the prior art plates are flat and form 90-degree angles to the side surfaces. The wafer 316 is show above the separator plates, defining a deposition space 312. In this figure, the gas flow velocities (arrows) are plotted as a function of the distance from the centerline of the array of gas separator plates (C/L) and the distance along the tops of the plates. The flow profiles were calculated using a computational fluid dynamic model derived using Fluent/UNS 4.2.5 program (from Fluent, Inc. Centerra Resource Park, 10 Cavendish Court, Lebanon, N.H. 03766), and the directions and linear speeds of the gas are shown by the arrows. In this model, gas velocity was 3.65 cm/sec through the gas flow channels 310. The model considered 2-dimensional laminar flow for compressible flow with heat transfer, with radiative, convective and conductive heat transfer to account for gas density changes. The Reynolds number for these analyses was about 1.0.

The gas speed is indicated by the lengths of the arrows in cm/seconds, and velocities are drawn to scale, with a scaling bar representing a linear flow rate of 1.0 cm/sec. The flow profile is asymmetrical, with the highest vertical flow rates being present near the centerline (C/L). Laterally from the centerline, the gas flow turns laterally, to become more parallel with the wafer 316.

FIG. 3b shows the gas velocity profiles of an array of prior art gas separator plates 308. The gas velocities are shown by the arrows, and the length of the arrows is proportional to the speed of the gas flow. The velocity scaling bar is 3.5 cm/sec. and corresponds to the highest velocity calculated for this part of this configuration. There are three plates 308 with gas flow channels 310 between them. As the gas flows upwards between the gas separator plates and exits into the space 312 above the plates, the flow of gas is non-uniform. Near the top edges of the gas separator plates 308, gas flow is directed in a parallel fashion to the top edges, and is slow, as indicated by the short arrows in a region of low velocity 311. This region of low velocity gas flow has increased residence time for the precursor gases to make contact with the separator plates 308, and consequently, powdery byproducts can deposit in this site. Further away from the top surfaces, the vectors are directed more toward the wafer and flow is rapid, as indicated by the long arrows. The wafer is held above the gas separator plates (not shown).

FIG. 3c is another depiction of the gas velocity profile of the prior art configuration shown in FIG. 3b. The gas separator plate on the right side of the figure is closer to the centerline of the array (not shown), whereas the leftmost plate 308 is farther from the centerline, thus accounting for the unequal flow profiles above each plate. In this figure, only the gas velocities 1 cm/sec and slower are shown. This makes more apparent the gas flow in homogeneity The gas velocities at the tops of the gas separator plates 308 are low, as indicated by the short arrows immediately adjacent to the tops of the plates in the areas 311. Many of the vectors indicate gas flow speeds of less than 0.1 cm/sec. Areas 311 are the sites of powder byproduct deposition.

Because the gas flow parallel to the top surfaces 311 of the gas separator plates is slow, there is opportunity for powdery byproducts to form in the gas phase and to deposit on the top surface. As the byproducts build up on the top edges of the gas separator plates, the effective distance between the top of the dispersion head and the wafer decreases. This leads to uneven film thickness uniformity. To maintain the thin film thickness and uniformity within specified limits, this byproduct must be periodically removed. The degree of byproduct buildup and the frequency of cleaning depends on many factors. For example, for the deposition of a undoped silicon dioxide layer at a deposition rate of 1000 Å per minute and a deposition temperature of 500° C., the byproducts must be removed after approximately 24 microns of film has been deposited on the wafer. (see Table 1). This frequency of cleaning is required to maintain the wafer-to-wafer (WTW) non-uniformity of the deposition process within ±2%. Removing the byproduct buildup requires stopping wafer processing, thereby reducing wafer throughput and productivity of the equipment.

Similarly, the other surfaces of the dispersion head shown in FIG. 1 are sites for deposition of powdery byproducts. The cooling plates and gas injector plates have flat surfaces, being either constructed with right angles (FIG. 1, 120) or beveled at an angle of about 45° (FIG. 1, 112). Thus, these other surfaces also must be cleaned often to prevent the undesired buildup of byproducts.

B. Regulation of Precursor Gas Flow During Deposition

Because of the uneven flow of gas across the wafer during deposition processes, there is an uneven deposition of thin film materials. As can be seen from FIG. 3a, the flow of gas is highest in the center of the wafer 316. Therefore, this is the site of the slowest deposition of thin films. One way of increasing the rate of deposition at this site is to cool the wafer at that location. However, film properties vary with deposition temperature. Furthermore, it is very difficult to closely regulate the temperature gradient of a wafer during deposition. Therefore, the uneven deposition on semiconductor wafers has been a difficult problem to overcome.

C. Byproduct Deposition on Walls of Deposition Chamber

In addition to the dispersion head elements becoming contaminated, other surfaces in the interior of the deposition chamber also become contaminated with byproducts. These include the interior walls of the deposition chamber itself.

Prior art devices have relied upon the manufacture of equipment whose interior surfaces is chosen to avoid adherence of the precursors and/or reactive intermediates and/or polymers. This makes cleaning the surfaces relatively easy. However, it necessitates the frequent cleaning, as weakly bonded contaminants can easily migrate to the substrate surface and contaminate the thin film.

Alternatively, materials have been chosen to maximize the bonding of precursors, reactive intermediates and/or polymers. This would permit a thicker layer of contaminant to be built up without severe migration of the contaminants to the substrate surface.

These methods both suffer from the problem that different precursors, reactive intermediates and polymers have different affinities for the materials comprising the interior surfaces of the manufacturing equipment. Thus, one interior surface can inhibit bonding of one type of precursor, intermediate or polymer, whereas a different precursor or intermediate can bond more tightly. Similarly, one interior surface can promote bonding of one type of precursor, intermediate or polymer, whereas a different precursor, intermediate or polymer can bond weakly. Furthermore, it is impractical to make separate deposition equipment designed specifically for a single type of molecular species to be deposited.

Therefore, the prior art deposition equipment suffers from the deposition of byproducts on various surfaces. The buildup requires frequent cleaning of the elements of the equipment, which necessitates shutting down the equipment. This results in loss of manufacturing efficiency and increase cost of semiconductor manufacture. Therefore this invention decreases the frequency of cleaning of deposition chamber equipment and improves the quality and quantity of thin films which can be deposited.

OBJECTS OF THE INVENTION

Therefore, one object of this invention is to reduce the amount of byproduct buildup on the surfaces of the dispersion head of a semiconductor CVD apparatus.

Another object of this invention is to increase the time period between dispersion head cleaning cycles.

A further object of the invention is to increase the throughput of wafers for chemical vapor deposition of thin films of dielectric material, metals, or etch stop layers or barrier layers used in the manufacture of electronic devices.

An additional object of the invention is to increase the uniformity of the deposited thin films.

A further object of the invention is the manufacture of walls of a deposition chamber which inhibit the deposition of byproducts.

Therefore the invention comprises new designs for the surfaces of deposition equipment which is subject to deposition of byproducts during chemical vapor deposition.

One aspect of the invention is new designs of gas separator plates to decrease the deposition of byproducts on the dispersion head.

Another aspect of the invention is a gas separator plate with a rounded upper edges.

Another aspect of the invention is a gas separator plate with an asymmetrical top edge.

A further aspect of the invention is an array of gas separator plates in which the distance between the top of the plates and the wafer varies with distance from the centerline of the array.

An additional aspect of the invention is an array of as separator plates with uneven spacing.

Yet another aspect of the invention are dispersion head surfaces with rounded contours.

Another aspect of the invention comprises deposition chamber walls which are porous to permit gas flow through them to decrease the access of byproducts to the interior surfaces.

BRIEF DESCRIPTION OF THE FIGURES

FIG. 3a is a gas velocity flow profile of a prior art array of gas separator plates.

FIG. 3c is a low velocity flow profile of prior art gas separator plates showing areas of byproduct deposition.

FIG. 4a is a drawing of one embodiment of a gas separator plate of the invention with rounded top edges and a flat area.

FIG. 5b is a schematic diagram of an array of gas separator plates and a semiconductor wafer of the invention shown in FIG. 5a.

FIG. 5c is a profile of gas velocities around gas separators of the embodiment shown in FIGS. 5a and 5b.

FIGS. 6a–6d are drawings of other embodiments of the gas separator plates of the invention.

FIG. 10a is depiction of an array of gas separator plates of the invention incorporating variously shaped plates.

FIG. 10b is an alternative embodiment of an array of gas separator plates of the invention as shown in FIG. 10a as shown with variously shaped plates and plate configuration.

FIG. 12a is a profile of gas velocities over the edge of a prior art cooling plate or gas injection plate.

FIG. 13b is a depiction of a cross-sectional view of one panel of a deposition chamber, showing the porous plate, the plenum area, and replenished gas supply.

FIG. 14 is a depiction of a portion of a porous panel, showing some details of construction.

Figure 1:
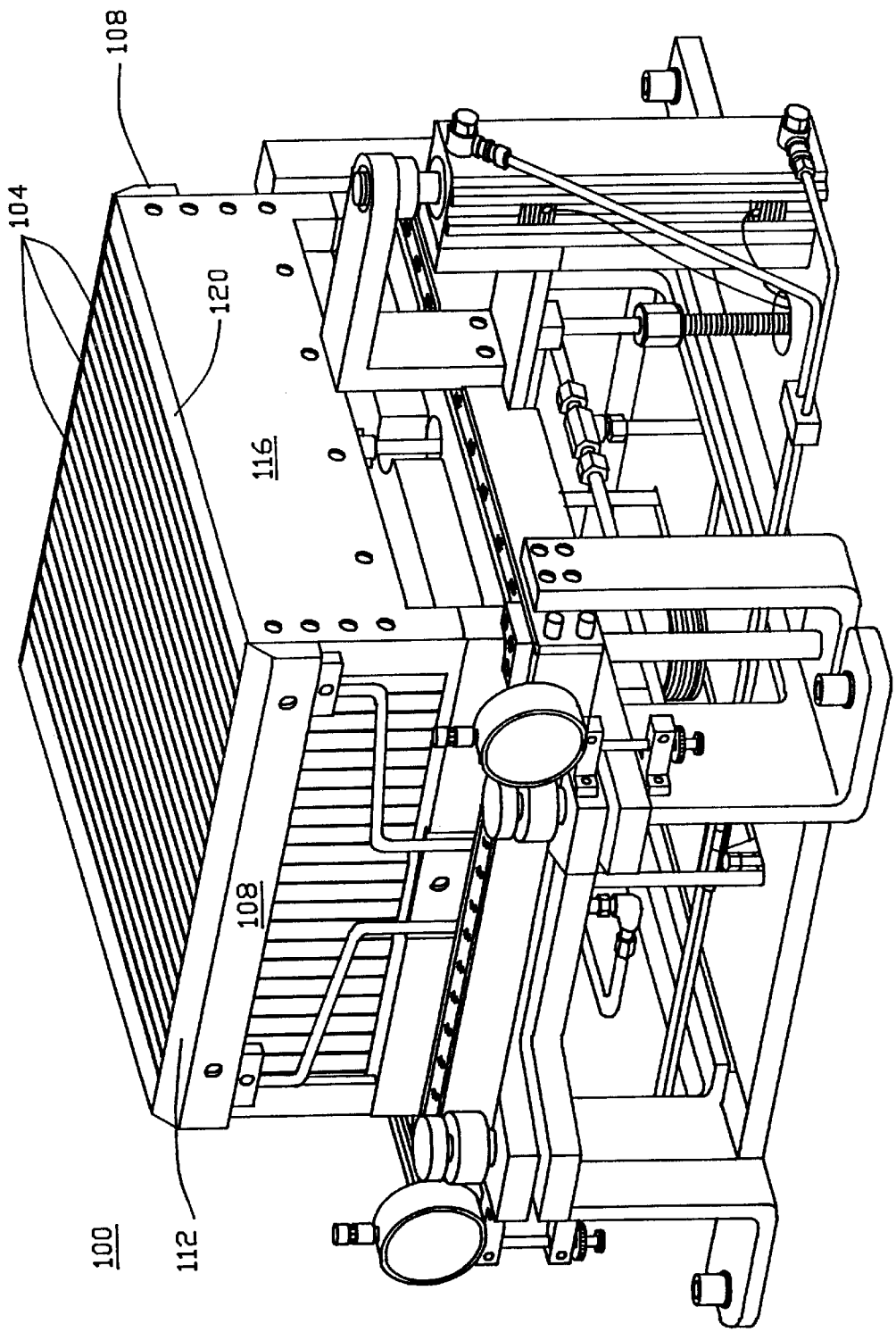
FIG. 1 is a drawing of the prior art dispersion head.
Figure 2:
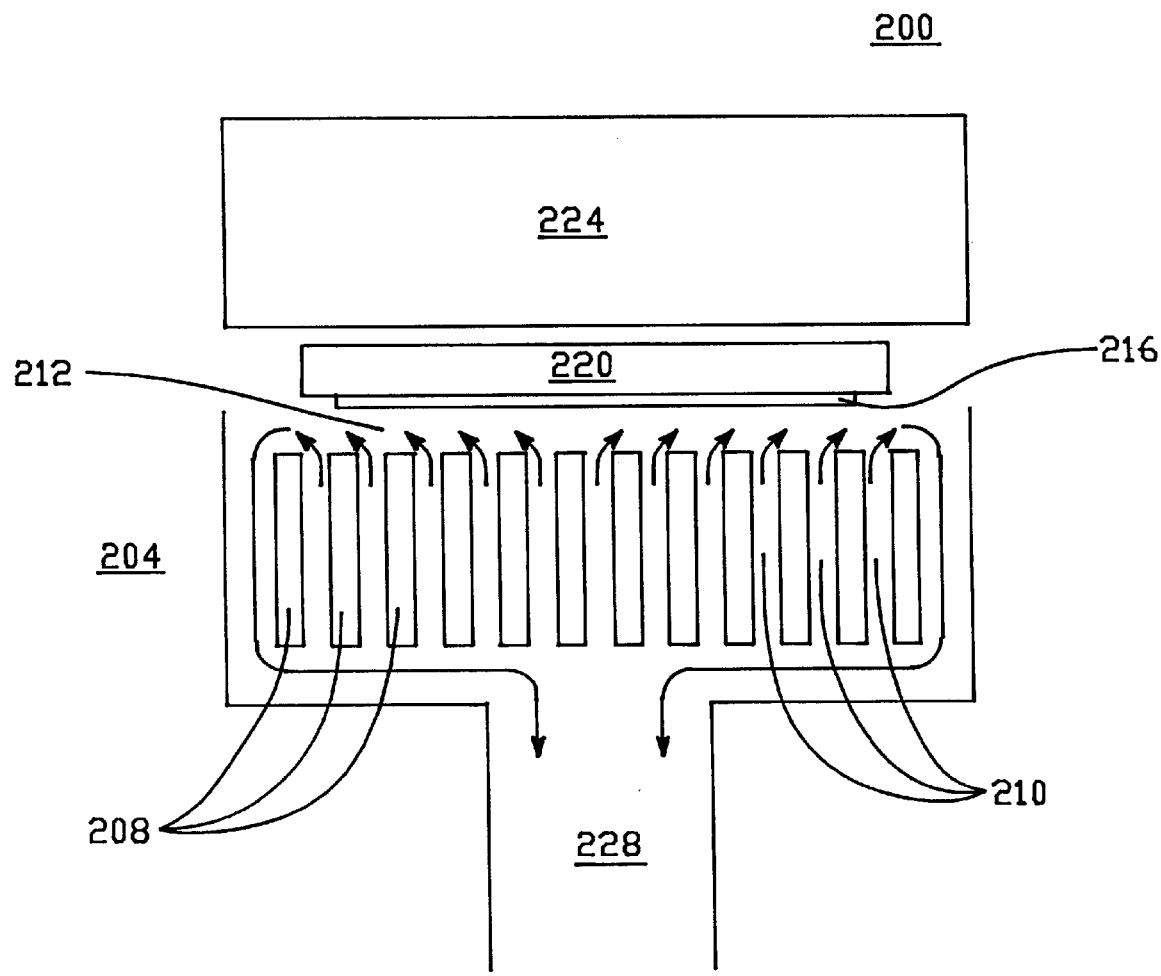
FIG. 2 is a schematic diagram of elements in a prior art dispersion head.

The Figures are more fully explained in the Detailed Description of the Invention.

DETAILED DISCLOSURE OF THE INVENTION

This invention decreases the deposition of byproducts in chemical vapor deposition equipment by decreasing the residence time of precursor gases. By decreasing the residence time, precursor gases have less opportunity to nucleate on the surfaces of components which make up the equipment reactors. The invention decreases residence time by providing curved, smooth elements, instead of the flat elements with sharp corners as is the case for the prior art devices. The curved elements can be placed wherever gas containing precursors flow over the equipment elements. These include the gas separator plates, the cooling plates, the gas injection plates, for example, although the embodiments contemplated are not limited to those specific elements. Rather, in any present configuration or future design, this invention can decrease deposition of byproducts and thereby improve product through put and manufacturing efficiency.

This invention also increases the uniformity of deposition of thin films by providing more even distribution of precursor gases over the semiconductor wafer surface. This is accomplished by varying the spacing, height, and shape of the gas separator plates as described below.

Additionally, the invention provides deposition chamber panels which inhibit the deposition of byproducts by providing gas flow through the panel to create a gas blanket over the interior surface of the panel.

The deposition of any material capable of being deposited by chemical vapor deposition or transport polymerization can be improved using this invention. The types of films deposited include, by way of example only, oxides such as $SiO_2$, metals such as aluminum, copper, tantalum, or titanium, etch-stop layers such as nitride and oxynitride and organic polymer dielectric materials, such as poly(paraxylylenes). This list is not intended to be limiting, and improvements in the deposition of all other materials deposited by CVD methods are considered to be part of the invention.

I. Gas Separator Plates

Several embodiments of this invention comprise new designs for the gas separator plates and new configurations of those plates. Prior art gas separator plates with sharp edges or corners and flat surfaces permit the deposition of byproducts because of low flow rates causing long residence times. In contrast, the present invention uses aerodynamic principles to optimize the shapes and configurations of elements within the dispersion head to minimize areas of low gas flow and thereby decrease deposition of byproducts. Additionally, the designs minimize the electrostatic charge accumulation which can cause particle accumulation on the edges of separator plates.

A. Design of Gas Separator Plates

Therefore, in this invention, the shapes and configurations of the gas separator plates are chosen to provide a gas dispersion head through which gases of differing physical properties can pass without prolonged residence time. For example, in one embodiment of the invention, shown in Example 4a–c, a gas separator plate has parallel sides, but has two rounded top edges with a narrow flat surface between them. In this embodiment, the thickness of the gas separation plate 408 plate is 0.78 inches. The radii of curvature of both sides of the plate are 0.03 inches, resulting in a flat top portion of the plate 416 of 0.018 inches. The round edges provides for smoother flow of gas as it exits the channel between the gas separator plates. The smoother flow permits higher linear gas velocities near the surface.

Figure 4B:
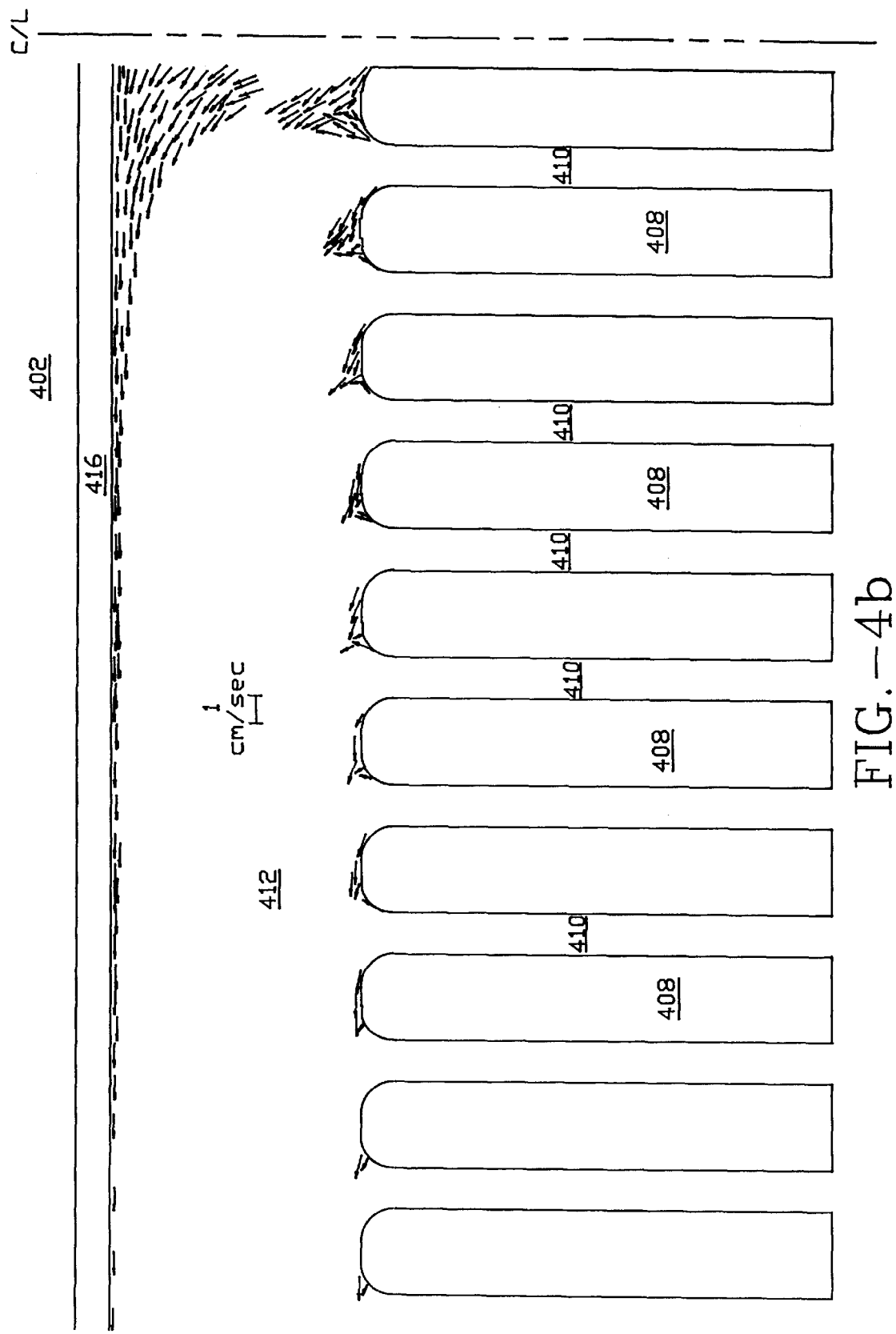
FIG. 4b is a schematic diagram of the invention of an array of gas separator plates shown in FIG. 4a and a semiconductor wafer with a gas flow profile.

FIG. 4b shows a calculated gas velocity profile of a portion of a gas dispersion head 402. The flow profiles were calculated using a computational fluid dynamic model derived using Fluent/UNS 4.2.5 program (from Fluent, Inc. Centerra Resource Park, 10 Cavendish Court, Lebanon, N.H. 03766), and the directions and linear speeds of the gas are shown by the arrows. In this model, gas velocity was 3.65 cm/sec through the gas flow channels 410. The model considered 2-dimensional laminar flow for compressible flow with heat transfer, with radiative, convective and conductive heat transfer to account for gas density changes. The Reynolds number for these analyses was about 1.0.

The dispersion head contains an array of gas separator plates 408 of the design shown in FIG. 4a. Only one-half of the array is shown, with the centerline (C/L) shown on the right side of the figure. The gas flows between the gas separator plates in gas flow channels 410, which are spaced evenly apart. Gas flow through the gas flow channels 410 is regulated to be of equal velocity and equal bulk flow rate through all channels of the array. The gas exits the top of the gas flow channels and into a space defined at the top by the semiconductor wafer 416. As gas moves into space 412, it is diverted laterally away from the centerline. The velocity vectors at various locations relative to the tops of the gas separator plates are proportional to the speed of gas flow. The bar indicates a speed of 1 cm/sec.

The figure shows that the velocity vectors of the gas separator plate on the right side are longest. The vectors near the gas separator plates become more lateral in orientation with further movement away from the centerline.

This figure also shows the presence of higher velocities near and at the centerline of the wafer. This results in decreased deposition rates at the center of the wafer.

Figure 3B:
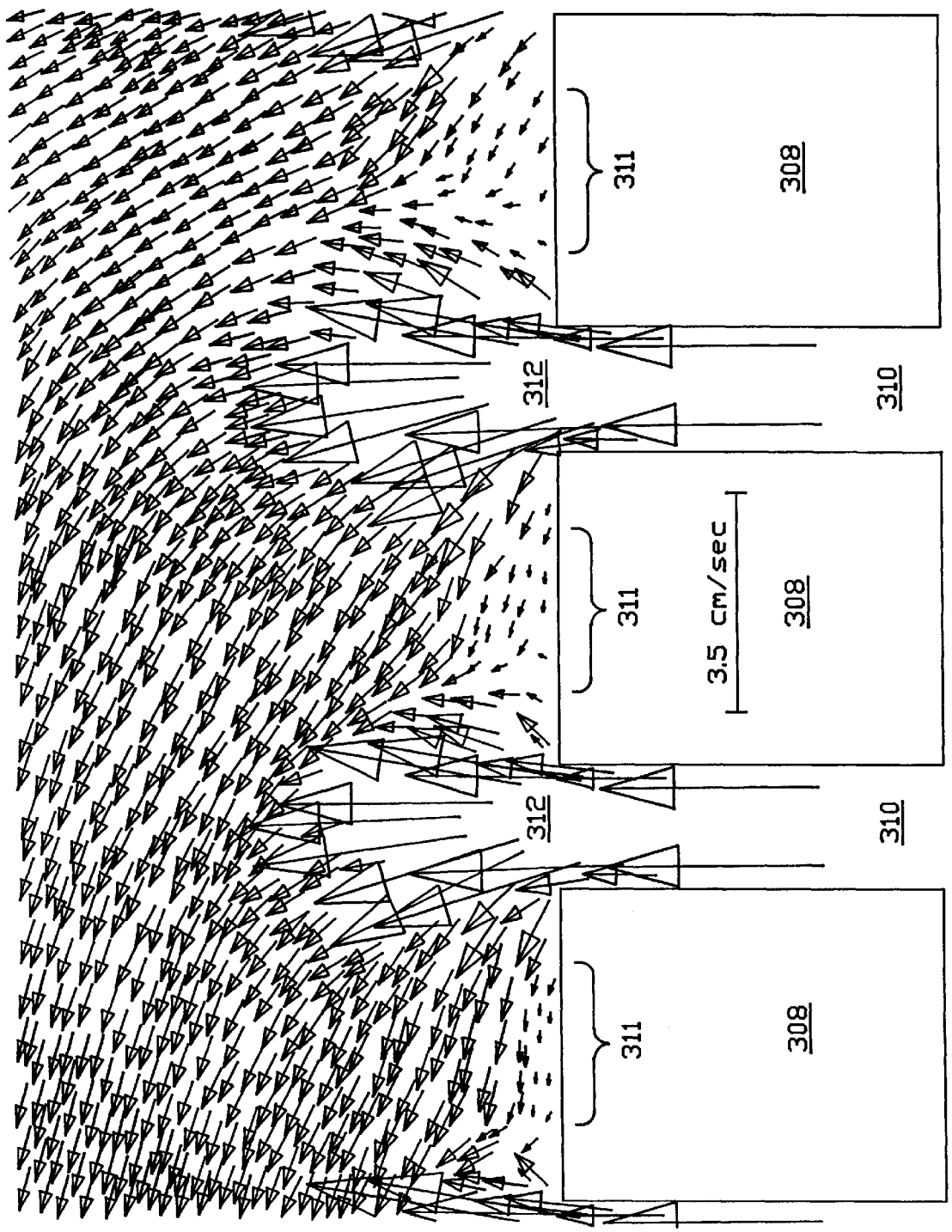
FIG. 3b is an expanded view of a velocity flow profile of the array shown in FIG. 3a comprising prior art gas separator plates showing areas of byproduct deposition.
Figure 4C:
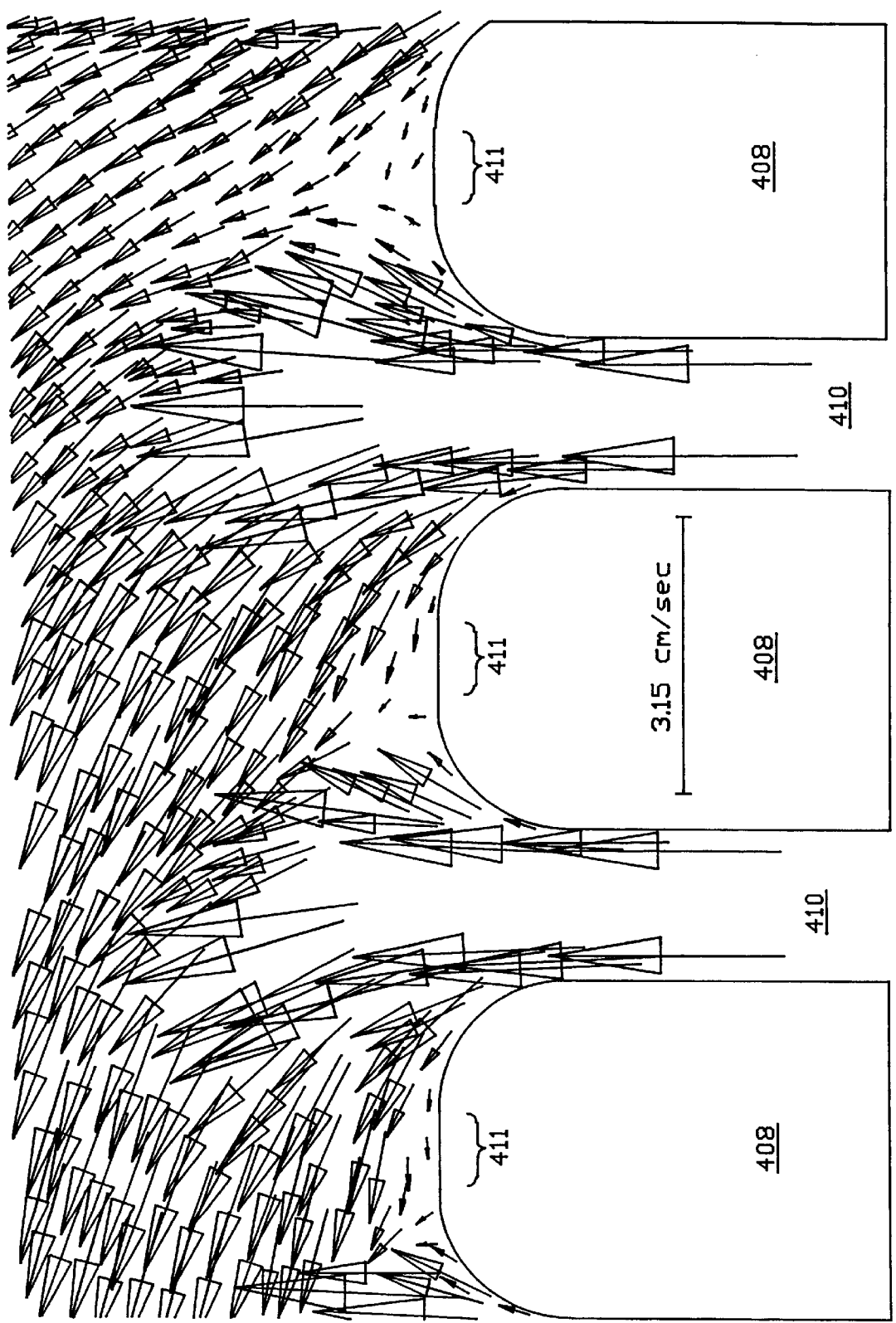
FIG. 4c is a profile of gas velocities around gas separators of the embodiment shown in FIGS. 4a and 4b.

FIG. 4c shows an expanded view of a portion of the gas velocity profile shown in FIG. 4b. The maximum velocity is 3.15 cm/sec. As the gas exits the gas flow channels 410, the longest vectors have an upwards orientation. However, on the top of the gas separator plates 408, there is an area 411 characterized by short vectors or low gas flow rates. In this embodiment of the invention, the area 411 is smaller and the small vectors are less numerous than in the flat topped gas separator plates of the prior art (see FIGS. 3a–3c). The lowest gas velocities are about 0.2 cm/sec.

Figure 4D:
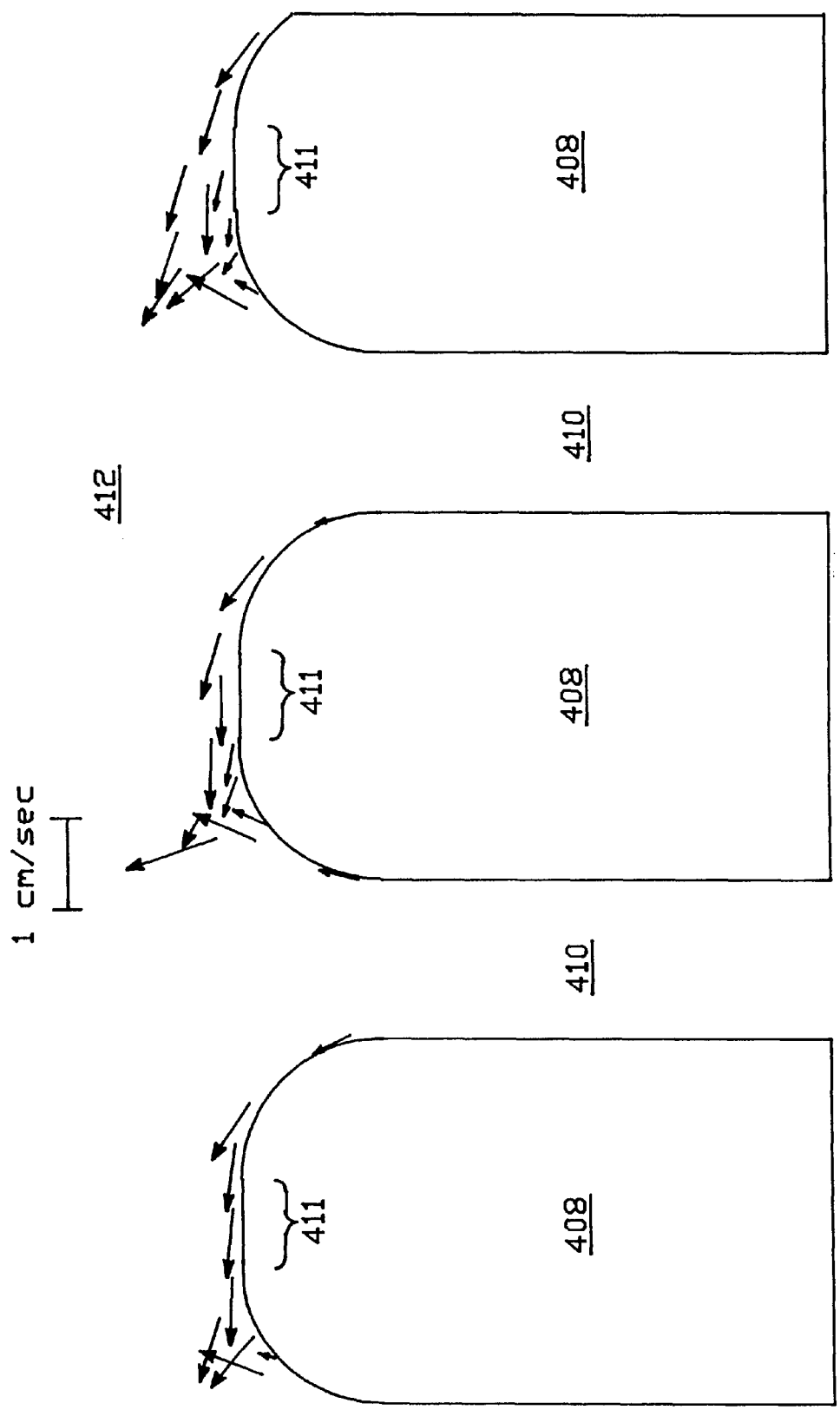
FIG. 4d is an additional profile of gas velocities around gas separators of the embodiment of the invention shown in FIGS. 4a–4c.

FIG. 4d shows the same portion of the gas separator plate array as in FIG. 4c, except that the high velocity vectors are not shown. This emphasizes the nature of the low gas flow in areas 411. Comparing FIGS. 3c with FIG. 4d, the rounded top edge reduces the size of the deposition area and increases the flow rates over those areas.

Figure 5A:
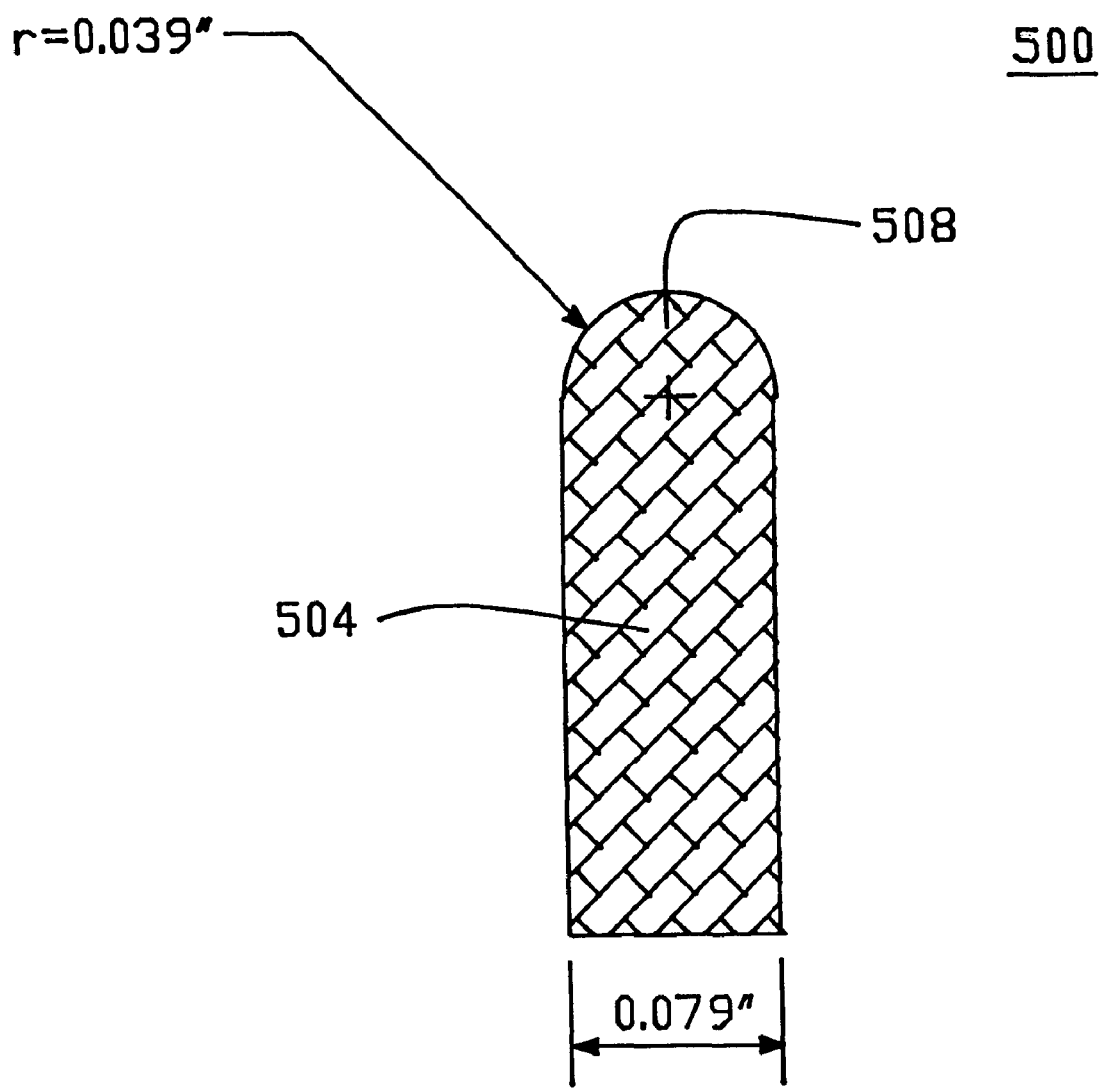
FIG. 5a is a drawing of another embodiment of a gas separator plate of the invention with a hemicylindrical cross-section and no flat portion on top.

FIG. 5a shows another embodiment of the invention 500 in which the gas separator plate 504 with a top end 508 which is hemicylindrical in shape, with the radius of curvature being 0.039" in this case. In this embodiment, the thickness of the plate is 0.079 inches. Plates with other thicknesses would have other radii of curvature. In this embodiment, the entire top surface of the gas separator plates are rounded, thereby eliminating any flat surface for byproduct to be deposited thereon.

Figure 5B:
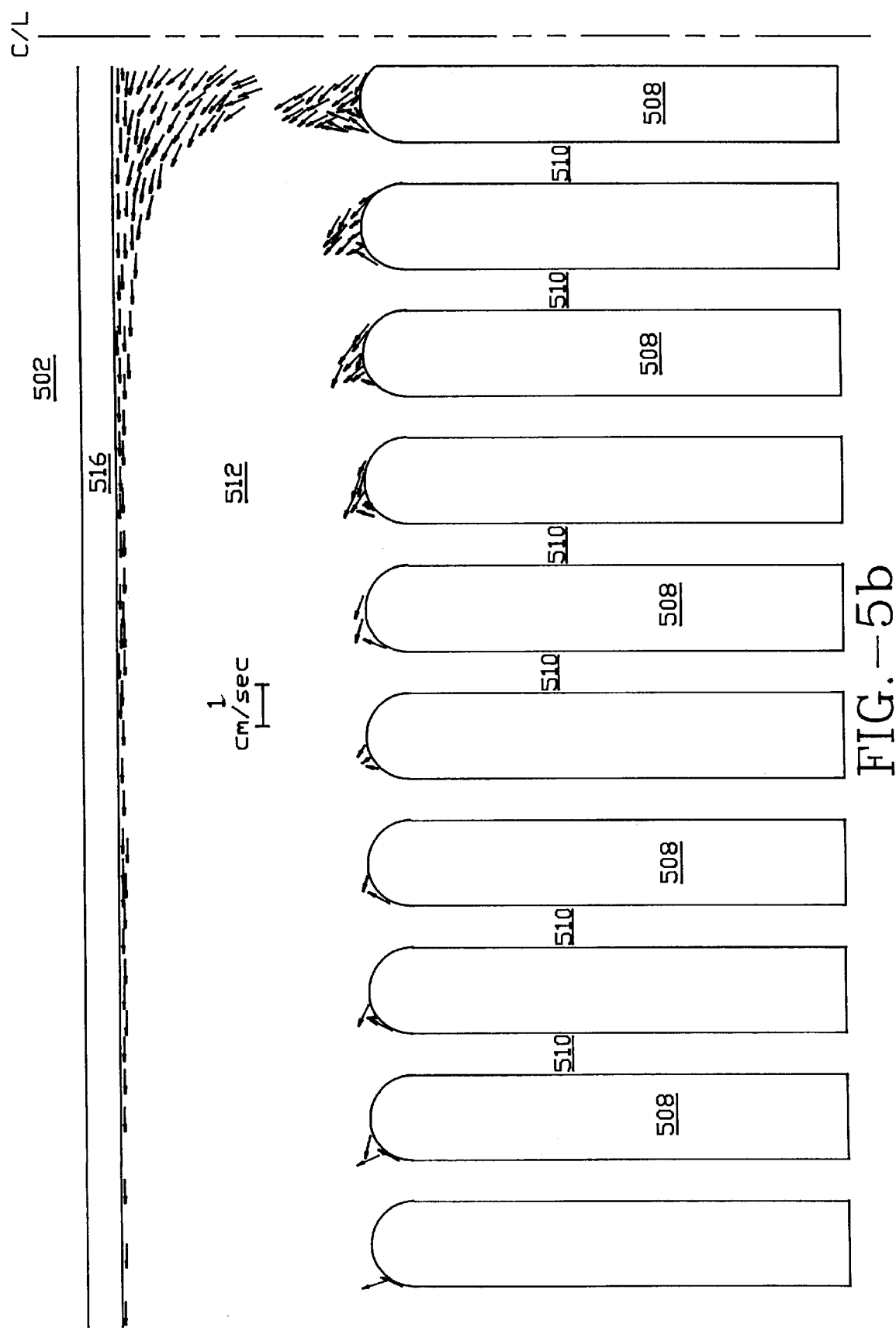

FIG. 5b shows the calculated gas velocity profiles for a portion of a dispersion head 502 comprising gas separator plates 508 as shown in FIG. 5a. The gas velocity vectors were calculated as for FIGS. 4b–d. This figure demonstrates that the gas flow profile in space 512 is similar to that for the previous embodiment shown in FIGS. 4b–4d. The scale bar indicates a gas speed of 1 cm/sec. As with FIGS. 4c–4d, the short vectors, indicating low gas velocities, are less than those in the prior art devices (see FIGS. 3b–3c).

FIG. 5c is an expanded view of a velocity flow profile for a portion of the dispersion head 502 comprising the gas separator plate configuration shown in FIGS. 5a and 5b. The low flow areas 511 are nearly nonexistent, with the lowest flow rates being about 0.3 cm/sec.

Figure 5D:
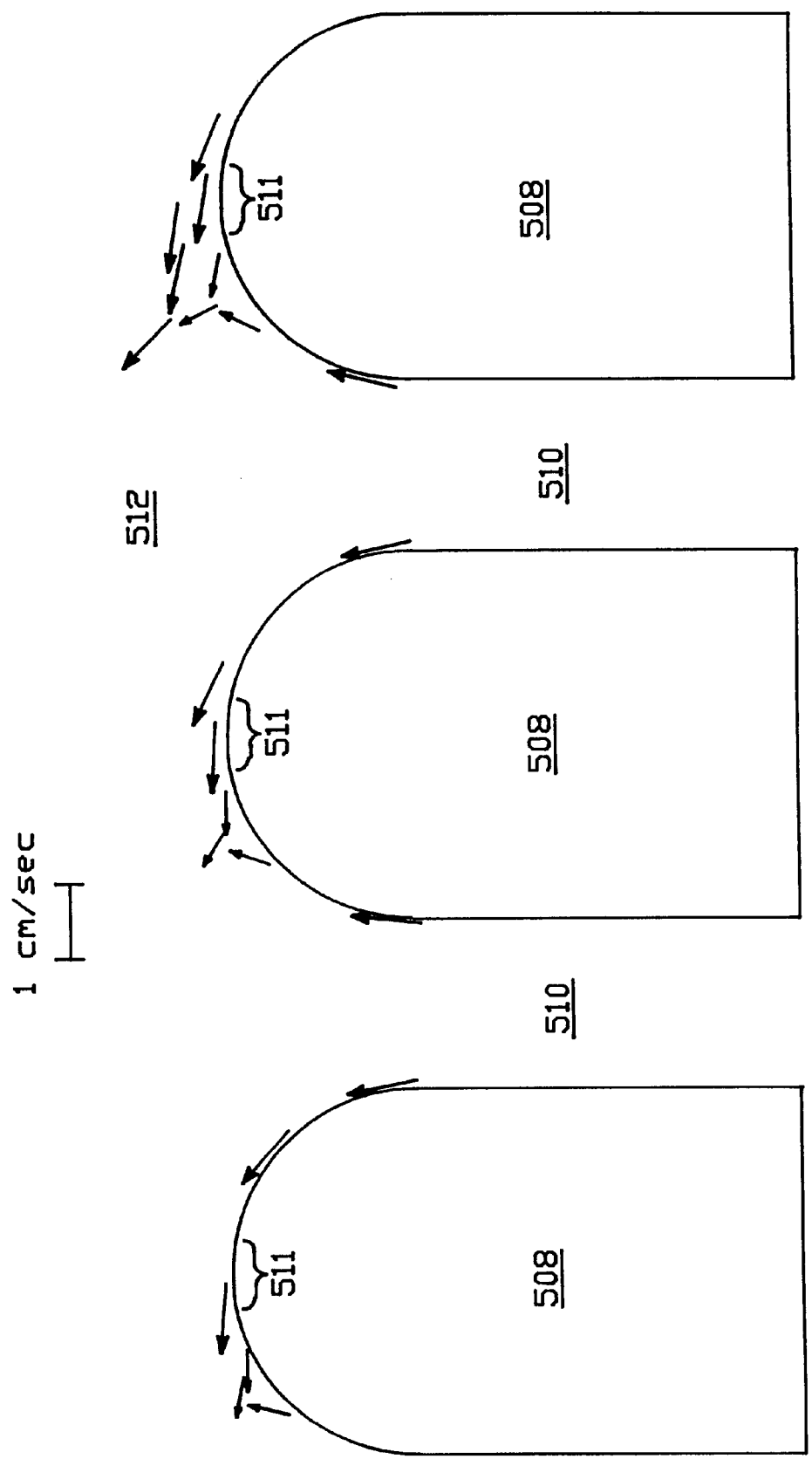
FIG. 5d is an additional profile of gas velocities around gas separators of the embodiment of the invention shown in FIGS. 5a–5c.

FIG. 5d shows the lowest velocity flow rates as shown in FIG. 5c. The low flow areas 511 are nearly nonexistent, with the lowest flow rates being about 0.3 cm/sec.

Thus, by making the gas separator plates more curved, the low flow areas are minimized and the magnitude of the lowest flow rates increases from about 0.1 cm/sec for the prior art gas separator plates, to about 0.2 cm/sec for the embodiment of the invention with rounded top edges, and about 0.3 cm/sec for the embodiment with the hemicylindrical shaped top.

FIG. 6 depicts other designs for gas separator plates of the invention. FIG. 6a depicts a plate 608 with a concave-convex shaped top 604. FIG. 6b shows a plate 608 with a heinielliptical top 612. FIG. 6c shows a plate 608 with a parabolic top 616. FIG. 6d shows a gas separator plate 608 with an asymmetrical top, with one side 624 being of a concave-convex design as the top in FIG. 6a, and the other side having a convex shape of either FIG. 5a, 6b, or 6c. Note that the preferred gas flow direction is toward the concave-convex side (the leading side), with the convex side being the trailing side.

The above descriptions are intended to be exemplary only, and are not intended to limit the scope of the invention. Other variations of shapes of gas separation plates can be determined using the above general principles, and all are considered to be part of the invention.

EXAMPLE 1

Deposition Rates Using Prior Art Gas Separator Plates

To quantify the effects of buildup of byproducts on the performance of dispersion plates, we performed a series of experiments in which we measured the film thickness of $SiO_2$ (in Å) deposited on a semiconductor substrate, through a dispersion head containing prior art gas separation plates. We deposited undoped silicate glass (USG) using a modified Quester 6000 prototype deposition system using tetraethylorthosiliane (TEOS) as the precursor. The dispersion head coolant (water) temperature was set to 8° C. to 25° C. The gap between the dispersion head and the wafer was set at 6 mm, with one dispersion head set at 5 mm, and the wafer temperature was set at 500° C. This configuration resulted in a temperature at the center of the dispersion head of 100° C., and an average temperature of 70° C. The TEOS flow rate was 30 standard liters/min, and the deposition time was 300 sec. The ozone concentration was 80 $gm/m^3$. This process resulted in a deposition rate of 1000 Å/min.

Film thickness and thickness non-uniformity was measured using a Prometrix SM150 film thickness analyzer. A total of 49 points were measured per wafer, with a 6 mm edge exclusion.

The thickness non-uniformity was calculated using the following relationship:

$$\% \text{ non-uniformity} = \frac{\text{maximum thickness} - \text{minimum thickness}}{2 \times \text{average thickness}} \times 100$$

Figure 7:
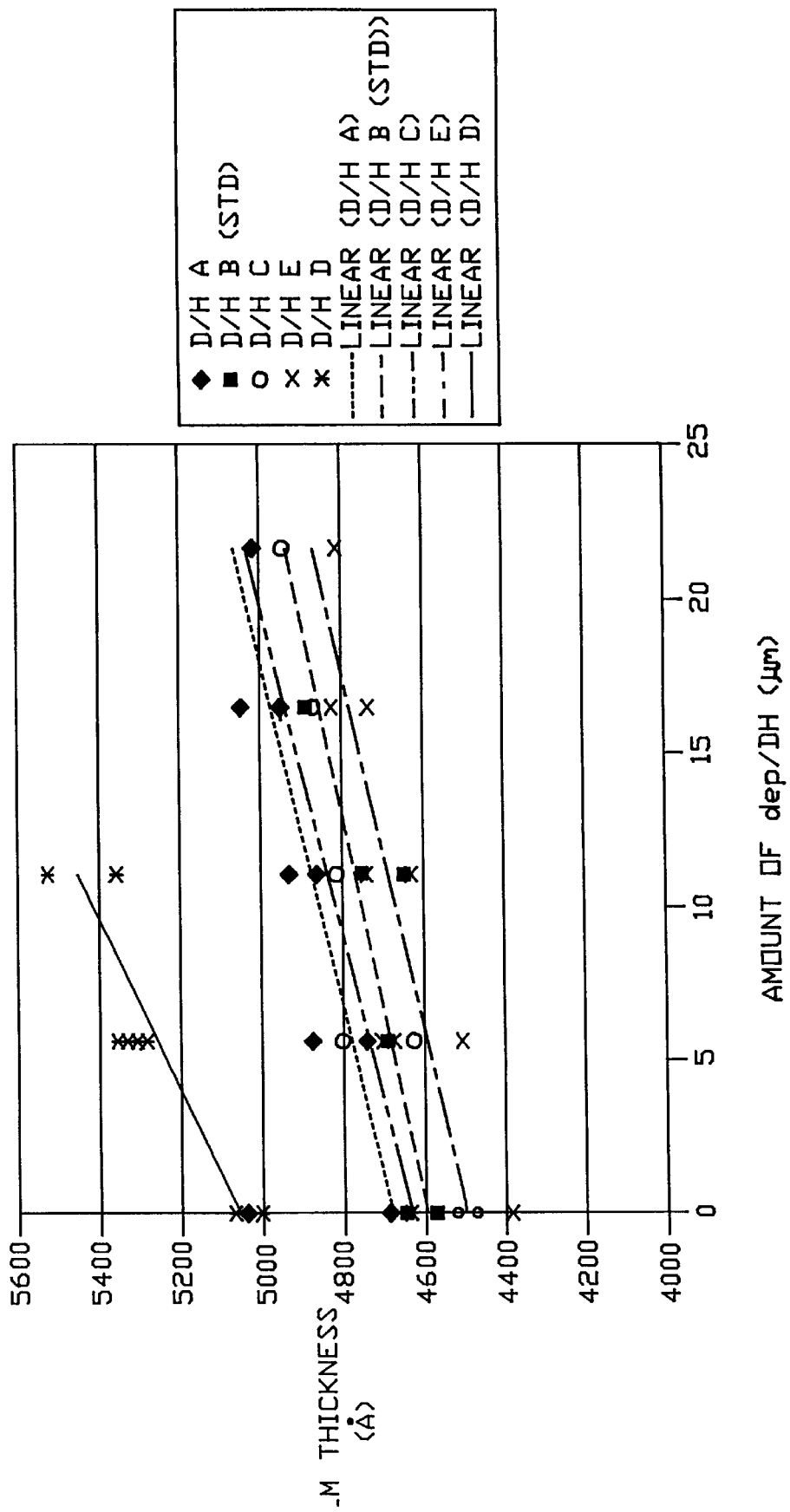
FIG. 7 is a graph of deposited film thickness as a function of total dispersion head use expressed in $\mu$m of prior art gas separator plates.

FIG. 7 shows the results of the study with the thickness increasing with total deposition time. The vertical axis represents the film thickness in Å and the horizontal axis represents the total amount of film deposited by the dispersion head since the last cleaning. For all the dispersion heads, there was an increase in film thickness as the total amount of film deposited increased. This is because as more film is deposited, the buildup of byproducts on top of the gas separation plates decreases the effective distance between the tops of the separation plates and the wafer. These results are quantified and shown in Table 1 below.

TABLE 1

Effects of Dispersion Head Byproduct Buildup on Deposition Rates Using Prior Art Gas Separation Plates

| Dispersion Head | Gap Distance (mm) | Slope (Å/μm deposited ± SD*) | Intercept (Å film thickness ± SD*) |
|---|---|---|---|
| A | 6.0 | 18 ± 2 | 4680 ± 19 |
| B | 6.0 | 17 ± 3 | 4588 ± 31 |
| C | 6.0 | 19 ± 3 | 4624 ± 31 |
| D | 5.0 | 36 ± 5 | 5050 ± 30 |
| E | 6.0 | 18 ± 3 | 4498 ± 29 |

*SD is 1 standard deviation from the mean.

Table 1 shows that the rate of increase in film thickness on the dispersion heads with 6 mm gaps is less than the rate of increase for 5 mm gaps. Thus, as byproducts build up on the gas separator plates, between-wafer nonuniformity increases. This is especially true for the configuration in which the initial gap was set at 5 mm.

EXAMPLE 2

Deposition Rates Using Prior Art Gas Separator Plates

To determine whether gas separator plates of the invention decreased the sensitivity of deposition rate due to total film deposited, we performed a series of experiments as described above in Example 1 except for replacing the gas separator plates of one half of dispersion head B with the rounded edge design shown in FIGS. 4a–4d.

Figure 8:
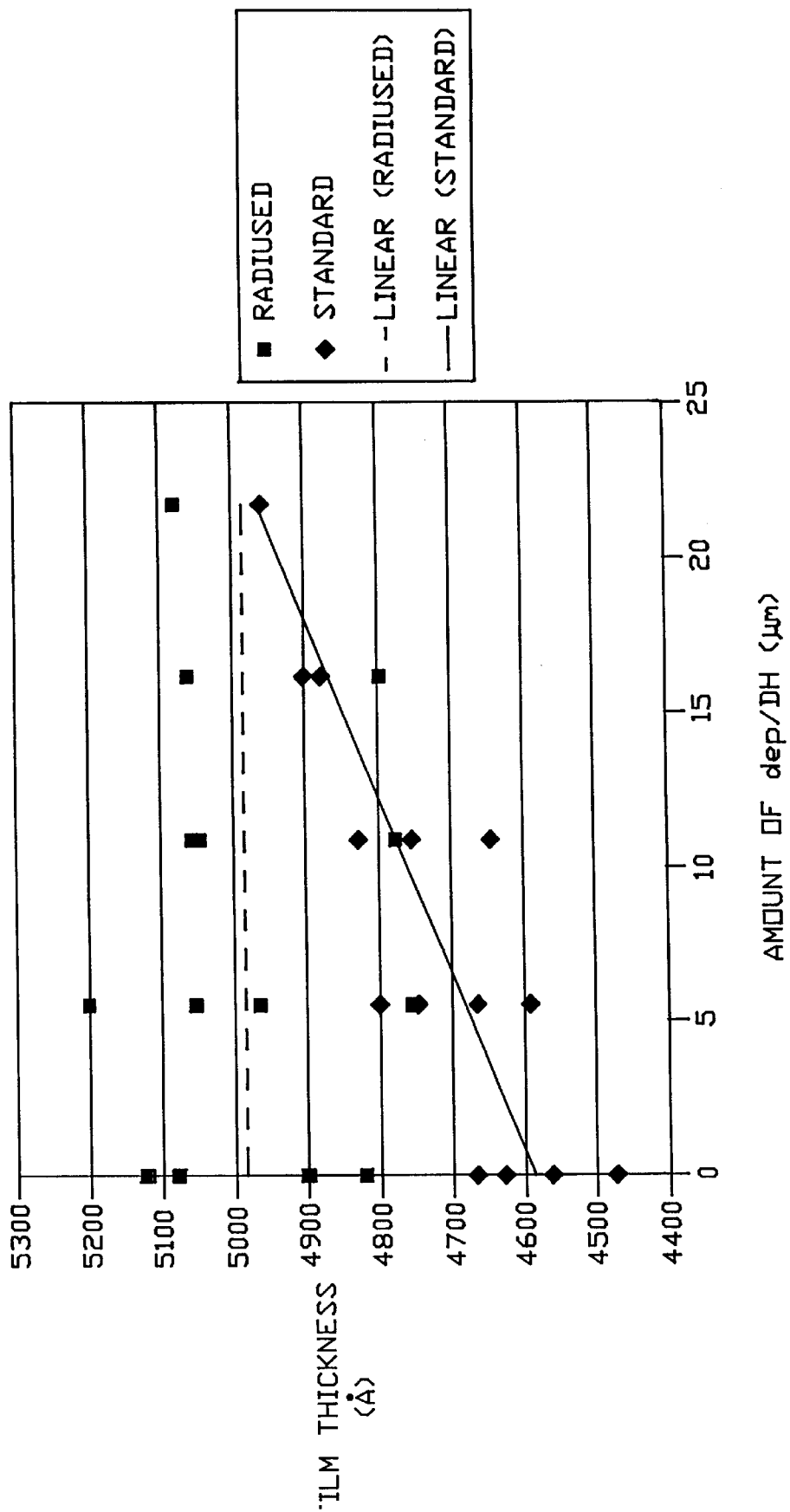
FIG. 8 is a graph of deposited film thickness of prior art gas separator plates and gas separator plates of the invention as shown in FIGS. 4a–4d.

The results are shown in FIG. 8, which is a graph of film deposition rate as a function of the total deposited film since the last cleaning of byproducts from the dispersion head. The half of the dispersion head with prior art gas separation plates are shown by diamonds ("standard"), and the half of the dispersion with gas separation plates of the invention are shown as filled squares ("radiused").

The prior art plates showed similar sensitivity of deposition rate on the total film deposited by the dispersion head. The slope of the relationship is of similar magnitude and error as for the previous experiment shown in Example 1. However, the half of the dispersion head comprising the gas separator plates of the invention show no sensitivity of deposition rate on the total amount of film deposited by the dispersion head. Table 2 provides a summary of the data shown in FIG. 7.

TABLE 2

Effect of Gas Dispersion Plates of the Invention On Between-Wafer Non-Uniformity

| Type of Gas Separation Plate | Gap (mm) | Slope (Å film/μm deposited) | Intercept (Å film) |
|---|---|---|---|
| Radiused | 6.0 | 0 ± 6 | 4973 ± 60 |
| Standard | 6.0 | 17 ± 3 | 4588 ± 31 |

Testing of a dispersion head made with gas separator plates of this configuration was performed by depositing a thin film of non-doped silicon dioxide with a process having a deposition rate of 1000 Å per minute and at a deposition temperature of 500° C.

Figure 9:
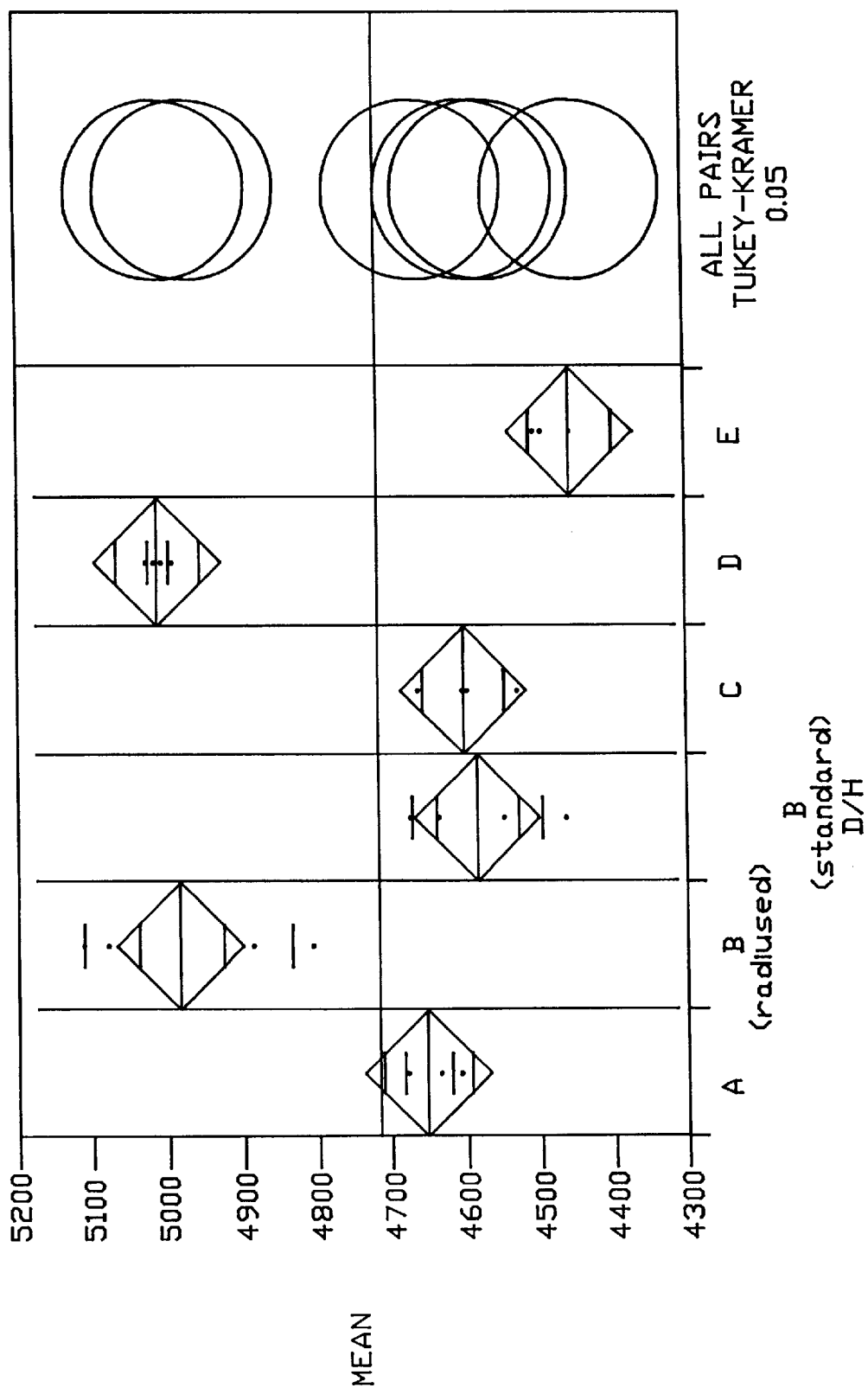
FIG. 9 is a summary of data plotted in FIGS. 7 and 8.

FIG. 9 shows a depiction of the thin film thickness of the prior two experiments (Examples 1 and 2) after a dispersion head cleaning was performed. The vertical axis represents the average film thickness and the horizontal axis represents dispersion head design. Dispersion heads A, B (standard gas separator plates of the prior art), C., and E all show film thicknesses below 4700 Å. In contrast, Dispersion head B with one half of the head comprising gas separator plates of the invention exhibited increased deposition rates of about 5000 Å during comparable deposition conditions. The increase in deposition rate achieved by replacing prior art gas separation plates by plates of the invention is about 9%. This improvement represents a significant increase in efficiency of deposition, and coupled with the elimination of buildup of byproducts, the invention enables the increased rate and efficiency of manufacture of thin films.

The data shown in Table 2 and FIG. 9 indicates that the gas separator plates of the invention substantially prevent buildup of byproducts during deposition. Therefore, the invention substantially eliminates the problem associated with buildup of byproducts during chemical vapor deposition. This means that the total amount of film which can be deposited without having to clean the dispersion head is increased substantially.

TABLE 3

Deposition Rates, Byproduct Deposition, and Cleaning Frequency for Gas Separator Plates

| Variable | Prior Art Plates | Embodiment of the Invention |
|---|---|---|
| Deposition Rate | 1000 Å/min | 1000 Å/min |
| Total Film Thickness | 24 μm | 80 μm |
| Wafer non-uniformity | 2% | 2% |

Table 3 shows that the buildup of byproducts was significantly reduced. Consequently, the byproduct buildup needed to be removed after approximately 80 microns of oxide deposited on the wafers to maintain the uniformity of the process within ±2% within-wafer non-uniformity. This is more than a three-fold increase in the quantity of film that can be deposited before processing is stopped for dispersion head cleaning.

B. Configuration of Gas Separation Plates

In addition to providing specific shapes for the gas separation plates, the invention contemplates new configurations of gas separator plates to decrease the within-wafer film thickness non-uniformity. It is known that the geometry of the array of gas separator plates determines the flow profiles of gas between them, and consequently, the buildup of byproducts during use. By increasing the cross sectional area of the gas flow channels between the gas separation plates, the linear gas speed can be decreased. However, if the plates are too far apart, the residence time of the reactive intermediates can increase to the point where byproducts can form on the sides of the plates. If the linear gas velocity is too low, the byproducts can deposit within the gas flow channels, thereby blocking or restricting gas flow.

Additionally, it is well known that the gas flow velocity and bulk flow rates are higher at more lateral portions of the deposition space between the tops of the gas separator plates and the wafer compared to the velocity and flow rates near the center of the wafer. The difference in velocity and flow rate is at least partially responsible for within-wafer film thickness non-uniformity.

FIG. 10a shows another embodiment of the invention 1000, in which the geometry of the array is configured to affect the flow of gas and the deposition of thin films. FIG. 10a shows one type of embodiment in which gas separator plates of different design are used in different areas of the array. For example, the gas separator plate 1008 at the centerline (C/L) is shown with a hemicylindrical, ellipsoidal, or parabolic top, with the deposition space 1012 having a thickness of $h_1$ between the top of the plate and the overlying wafer 1006. Laterally, other gas separation plates 1009 are shown with different design, in this case comprising an asymmetrically shaped top portion. The plate laterally adjacent to the central plate is shown with a deposition space thickness of $h_2$. The more lateral plates 1009 are shown with deposition space thicknesses of $h_3$. In this fashion, the thickness of the gap between the gas separator plates and the wafer can be controlled to decrease the change in gas velocity toward the periphery of the wafer. Thus, the distribution of gas flow can be regulated.

FIG. 10b shows an alternative embodiment in which the distances (d) between the gas separator plates are larger toward the periphery of the array. Such a configuration decreases the linear velocity of the gas through the more peripheral gas channels 1010. In combination with providing different thicknesses of the deposition space 1012 ($h_1$, $h_2$, and $h_3$), the array of gas separator plates can be designed to provide many desired flow patterns to optimize the flow pattern to achieve better film thickness uniformity.

The embodiments shown are by way of example only. Many different configurations of gas separator design, gas separator plate spacing, and deposition space thickness can be designed using the general principles of this invention, and all are considered part of the invention.

C. Regulation of Bulk Gas Flow Rates and Velocities

Additionally, by regulating the bulk flow rate of precursors into the deposition space, the rate of deposition can be adjusted. For certain applications, the rate of deposition is to be maximized. Such applications include, by way of example only, the deposition of dielectric or metal layers in which a thicker film is needed. For other applications, a much thinner layer is desired. These include, by way of example only, the deposition of etch stop or barrier layers of nitride, oxynitride, or other thin films of materials.

Additionally, for certain applications the flow rate of reactive intermediates must be high to minimize the formation of byproducts or reformation of the precursor. High flow rates are necessary if the lifetime of reactive intermediate species is short. Therefore, to prevent reformation of precursors, or formation of polymers in the gas phase, flow rates and linear velocities through the gas channels must be high. However, if the velocity of gas across the wafer is too high, the deposition rates decrease. Therefore, to optimize the deposition of these types of highly reactive intermediates, careful control over the aforementioned aspects of the deposition process is necessary.

In contrast, for the deposition of intermediates that are more stable, the residence time within the dispersion head need not be kept low, and flow rates can be increased to maximize deposition rate. For example, the re-dimerization of the precursors of poly(para-xylylenes) is not favored at low pressure, and therefore, the precursor flow rate can be adjusted to achieve a desired deposition rate without undue likelihood of contaminating the resulting film with dimers.

II. Deposition Head With Porous Membrane

Figure 11:
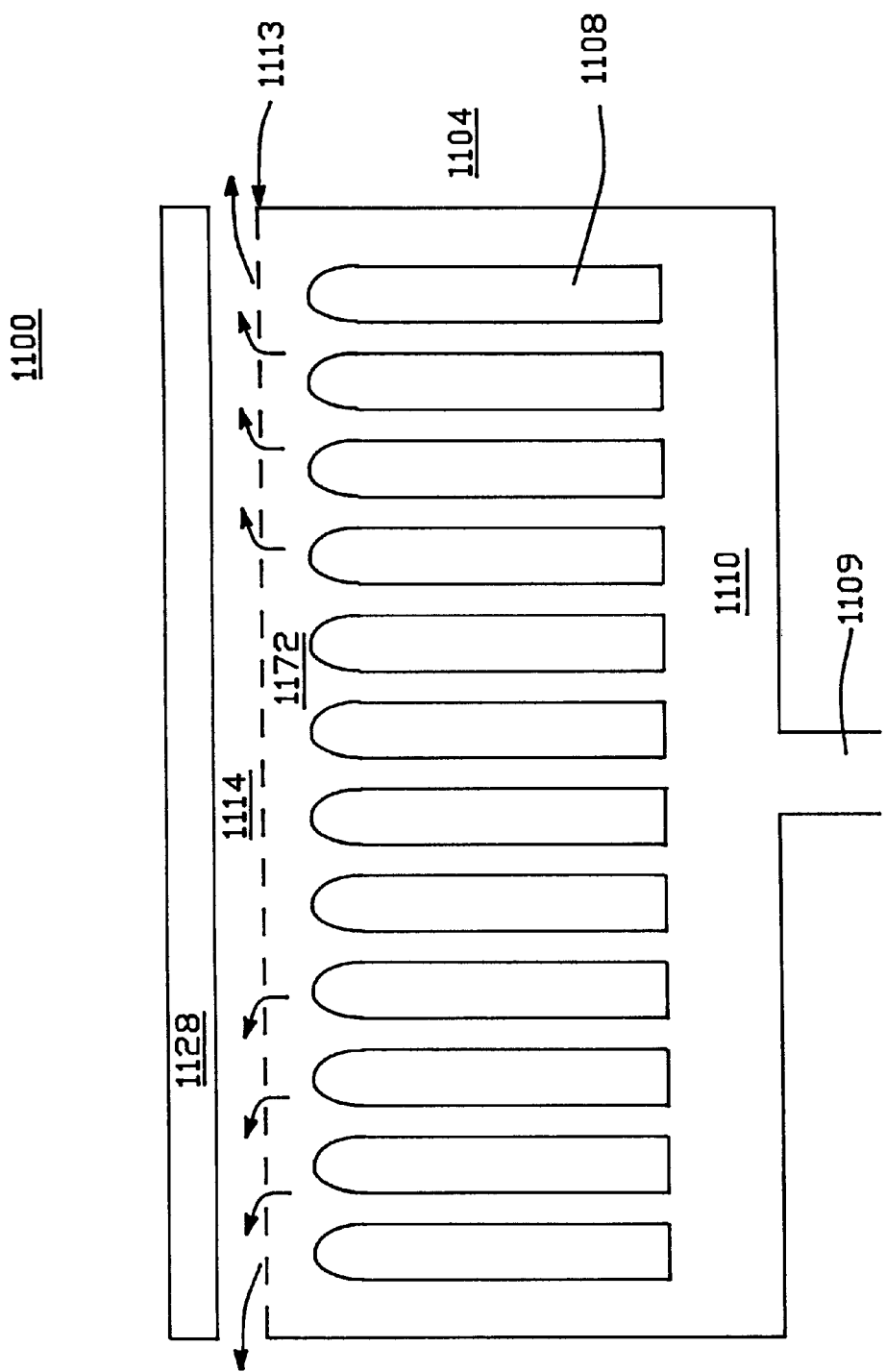
FIG. 11 is a depiction of an embodiment of an array of gas separator plates of the invention with a porous plate between the array and the wafer.

FIG. 11 shows another embodiment of the invention 1100, in which a deposition head 1104 comprises an array of gas separator plates 1108, here shown with a parabolic top end. Gas flows into the dispersion head through a port 1109 and enters a mixing chamber 1110. Thereafter, the gas flows through gas channels between gas separator plates 1108 and into a space 1112 defined by the tops of the gas separator plates and a porous membrane 1113. The membrane has micropores which provide for small channels through which precursors flow before entering deposition space 1114. The other side of the deposition space is defined by wafer 1128. During deposition, the membrane filters out any powder that was formed during passage through the array of gas separator plates.

The size of the pores is not critical, it only needs to be sufficient to filter out aerosolized byproduct particles and the pores should be sufficiently numerous to provide adequate gas flow across the membrane. Typical pore sizes are in the range of about 0.1 µm to about 500 µm, preferably from about 0.2 µm to about 20 µm, and more preferably about 0.5 µm. However, the total pore cross-sectional area should be sufficiently small to maintain the desired pressure drop and linear gas velocities across the membrane. Because the pores in membrane 1113 are small, the linear velocity of gas through the pores should be sufficiently high to prevent the accretion of byproducts on the membrane 1113. Thus, the gas reaching the deposition space 1114 is less contaminated by aerosolized byproducts. Additionally, the membrane 1113 disrupts the relatively large areas of high velocity gas seen in FIGS. 3, 4 and 5. Thus, within-wafer non-uniformity is decreased and the purity and quality of the deposited film is maximized.

The material used as membrane 1113 can be any metal, ceramic, glass or organic material which is non-reactive with the precursors, and has sufficient mechanical strength to provide numerous micropores of consistent size. By way of example only, the membrane can be made of stainless steel. One such material is a Mott Porous 3161 Stainless steel, series 1100, obtained from Mott Corporation, 84 Spring Lane, Farmington, Conn. 06032. The thickness of the material should be sufficient to withstand the pressure differential across the panel. By way of example only, the thickness can be 0.047 inches. Additionally, a suitable organic polymer can be Vespel™, a trademark of the DuPont Corporation. Typically, for atmospheric pressure deposition, the pressure gradient across the membrane is in the range of about 0.01 pound per square inch (psi) to about 100 psi, preferably about 1 psi to about 10 psi, and more preferably, about 0.1 to about 1 psi. In addition to stainless steel, other materials can be used so long as the material can withstand the temperatures and pressures commonly used for deposition of semiconductor thin films.

For convenience, the membrane 1113 should be easily removable from the dispersion head for cleaning. Ideally, it can be removed without shutting down the apparatus. Cleaning the membrane can be by back-flow using suitable liquid solvents or gases.

III. Cooling Plates and Gas Injection Plates

The invention also contemplates improvements in the shapes of components of the dispersion head other than the gas separator plates. Other sites which are contaminated during thin film deposition include the cooling plate 108 shown in FIG. 1, and the gas injector plate 116. The top edges of these plates typically comprise a flat surface with an edge. As exemplified in FIG. 1, the cooling plate has a bevel of about 45°, and the gas injection plate has a flat top at a 90° angle to the side wall. In fact, any flat surface of the dispersion head can become contaminated.

FIG. 12a depicts the gas flow velocity profile of a beveled edge 1204 of a cooling plate 1200. In this figure, gas flows out of the deposition space (on right; not shown) and over the top surface of the cooling plate 1200. Upon reaching the edge of the bevel 1204, there is an area 1205 with decreased gas velocity. The velocities of gas are proportional to the length of the vectors, and is calibrated using the bar, which indicates a velocity of 1.61 m/sec. The site of buildup of byproducts is along the surface of the bevel 1204. The buildup results in contamination of mechanical and chemical elements of the deposition chamber, and must be cleaned periodically. As the gas flows further down the side of the beveled edge and onto the side panel 1206, the free-stream velocity of the gas to the side 1220 increases. Thus, the buildup is localized to the beveled portion of the cooling panel or gas injection panel.

Figure 12B:
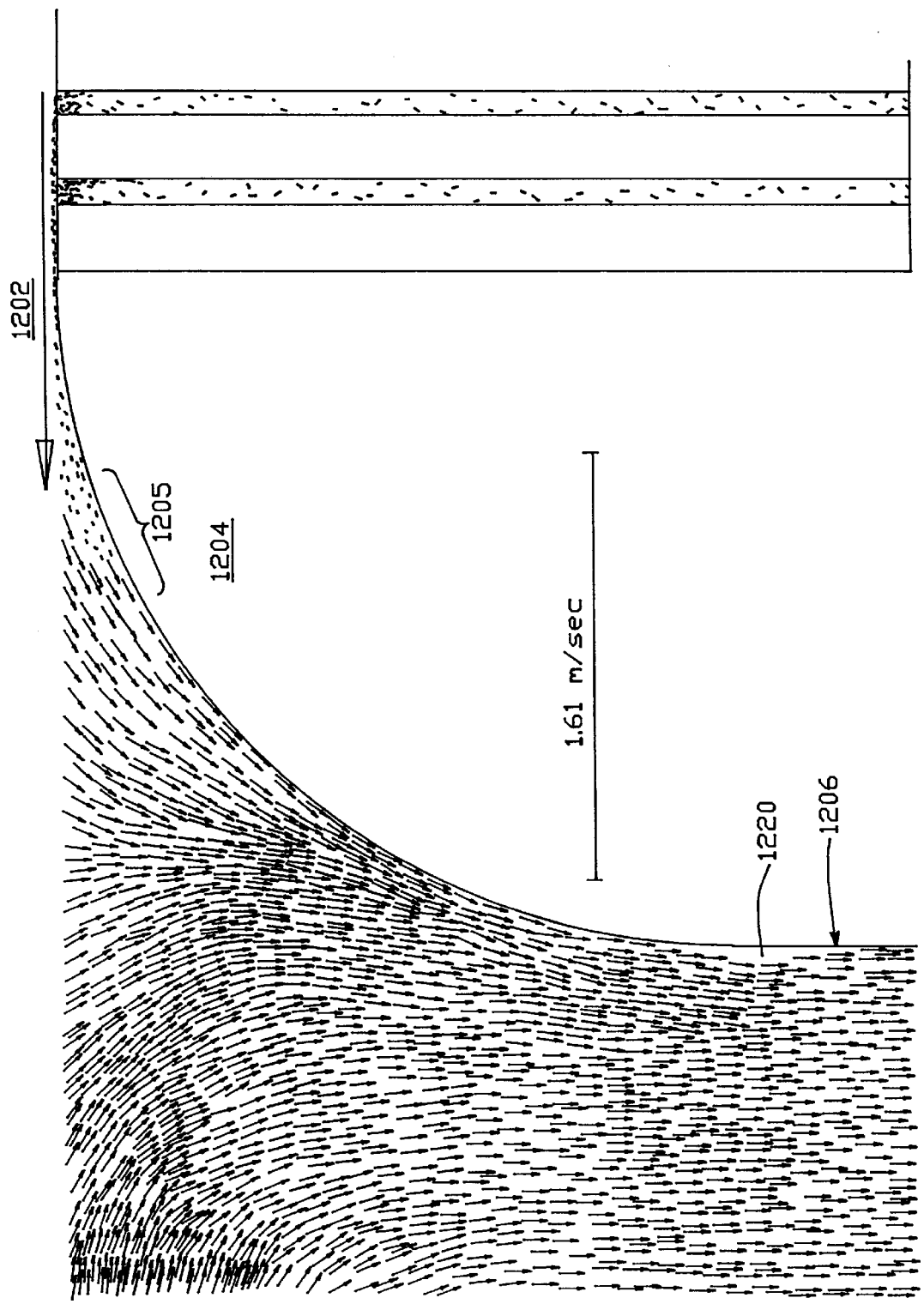
FIG. 12b is a profile of gas velocities over the edge of an embodiment of a cooling plate or gas injection plate of the invention.

To overcome the buildup of byproducts on the tops of these elements of the dispersion head, the top portion of the cooling plate and the gas injection plate are rounded. FIG. 12b shows an embodiment of the invention 1202 in which the edge 1204 is of constant radius. Also shown is the gas velocity profile calculated as in prior Examples and Figures. Gas exits from the gas channels on the right of the figure into the deposition space. The gas then flows laterally to the left, over the top edge of the cooling plate. Because of the curved surface, the gas flows in a laminar fashion without creating areas of low flow rate. Consequently, little powdered byproduct is deposited on the surface.

IV. Self Cleaning Sidewall Panels

This aspect of the invention relates to a surface and a process which produces an adjustable gas blanket over the interior surfaces of a deposition chamber for CVD and/or TP. The gas blanket either prevents the surface from making contact with any substance other than the gas in the blanket, such as reactants and byproducts, or alternatively, reduces the amount of contact between the surface and any potential contaminant. The gas blanket produced over the surface of the equipment prevents the films deposited by the equipment from making contact with the surface, and subsequently adhering to the surface.

The surface is typically constructed of a porous sintered material backed by a plenum area, which contains a replenished gas supply. A pressure differential is established between the inside of the plenum area and the outside surface of the porous material. This pressure differential causes the gas to flow from the plenum area through pores in the porous material, and onto the surface to be protected.

The panel can be made of any convenient material, including by way of example only, stainless steel. However, the material should be able to withstand the temperatures, and temperatures commonly used for deposition of semiconductor thin films. One such material is a Mott Porous 3161 Stainless steel, series 1100, obtained from Mott Corporation, 84 Spring Lane, Farmington, Conn. 06032. The thickness of the material should be sufficient to withstand the pressure differential across the panel. Typically, for atmospheric pressure deposition, the walls can be relatively thin. However, for reduced pressure deposition, in the range of about 0.01 Torr, the walls should be between about 0.01 and about 0.2 inches in thickness for chambers built to accommodate 8" diameter wafers.

In general, the invention provides a surface barrier formed by the gas flow preventing reactant gases or byproducts from impinging on the reactor chamber surfaces. Such a barrier can be a membrane with a high density of perforations, including the use of porous materials which would provide a more uniform gas distribution. As both hole size and hole density can be controlled in the manufacture of the porous material, the gas flows can be controlled to minimize perturbing the flow of reactants used for depositing thin films.

The size of the pores should be selected to optimize gas flow requirements and have a sufficient pressure drop across the pores to provide a uniform distribution of the blanket gas. Pores diameter is typically in the range of from about 0.1 $\mu$m to about 100 $\mu$m, preferably from about 0.2 $\mu$m to about 5 $\mu$m, and more preferably from about 0.2 $\mu$m to about 0.5 $\mu$m.

The panels can be designed to meet specific needs of the user. For example, the panels need not be of the same size and shape. Additionally, all walls of the deposition chamber can comprise these panels. In general, wherever unwanted contamination occurs, the panels of this invention can be used to decrease deposition of byproducts.

Figure 13A:
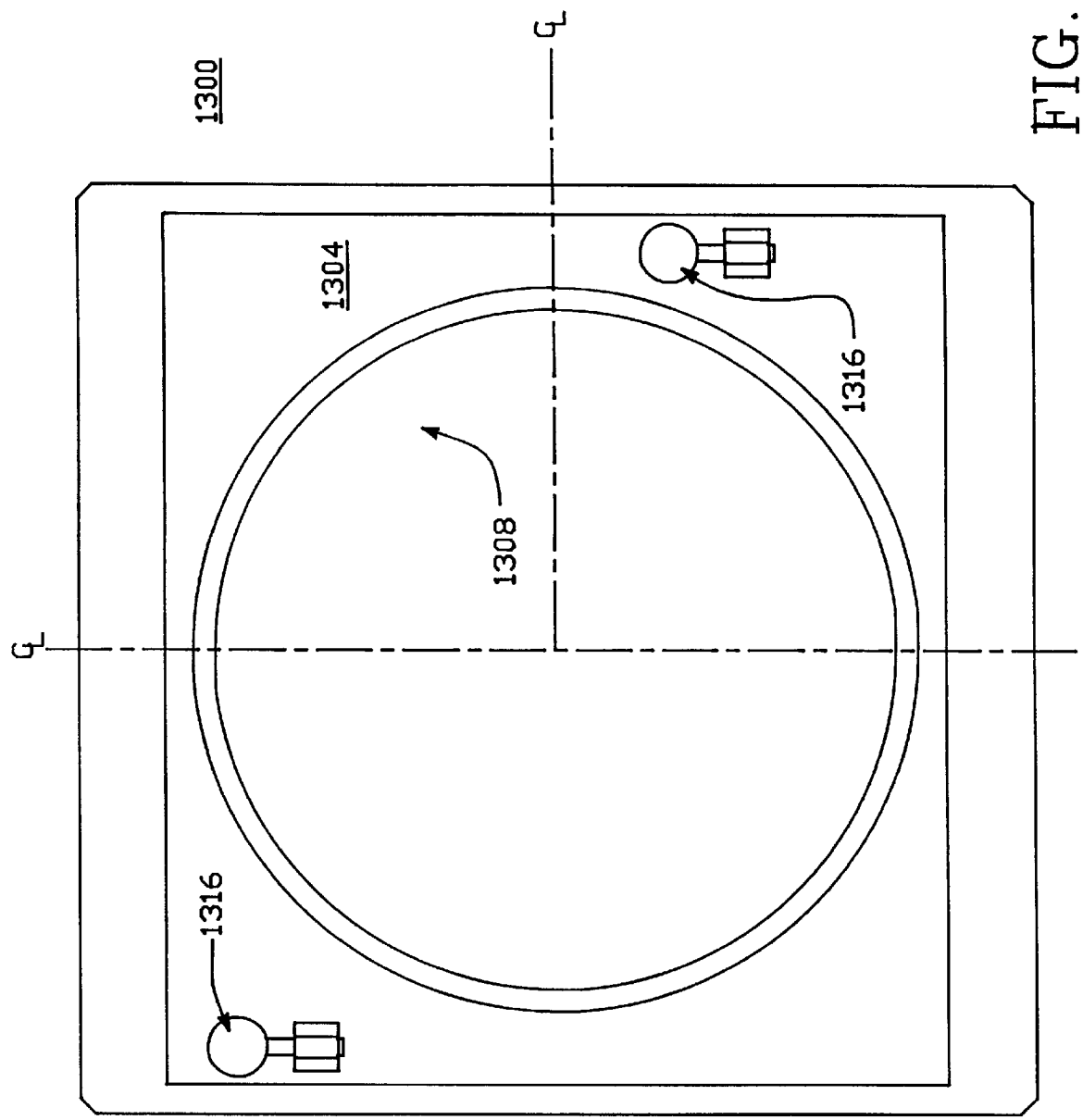
FIG. 13a is a top view depiction of an embodiment of the deposition chamber panels of the invention.

FIGS. 13a and 13b show some details of construction of the panel assembly. Dimensions are in inches. FIG. 13a is a depiction of a top view of a portion 1300 of a deposition chamber, including the top panel member 1304 adjacent to a chuck 1308. Ports 1316 are for injection of blanket gas into the panel member.

FIG. 13b is a depiction of a cross-sectional view through a panel 1308, showing the inlet ports 1316 for injection of blanket gas, a back panel 1320 which does not permit the passage of the blanket gas there through. Gasket element 1324 separates the back panel 1320 from the sintered element 1328, thereby creating an interior space (not shown) within the panel 1308. Blanket gas flow is from the interior space (not shown) through the porous member as indicated by arrows 1340.

FIGS. 14a–14c depict some details of construction of a panel of the invention. The dimensions are in inches. In FIG. 14a, the back panel 1420 is attached to gasket material 1424, which is attached to a mounting bracket 1436. The gasket 1424 is attached to a porous membrane 1428, which permits the flow of the blanket gas therethrough as shown by arrows 1440.

FIG. 14b shows details of the construction of one end of panel 1408, with the back panel 1420 attached to gasket 1424, which is attached to the mounting bracket 1436. The gasket is attached to porous membrane 1428, which permits blanket gas to pass, as shown by arrows 1440.

FIG. 14c depicts details of another type of mounting of panel 1408. The back panel 1420 is attached to mounting bracket 1436, which is attached to gasket 1424, which, in turn, is attached to porous membrane 1428, which permits blanket gas to pass, as shown by arrows 1440. Element 1424 can also be porous to prevent deposition on its outer surface 1426.

The blanket gas used can be selected to be inert or may be selected to inhibit chemical reactions from occurring near the panel surface. By way of example only, $N_2$, Ar, He, or $O_2$ can be used. Moreover, the gas should be chosen to not interfere with the chemical reactions which are intended to occur on the semiconductor substrate surface. For example, the deposition of $SiO_2$ can be accomplished using any of the aforementioned gases. However, for the deposition of organic polymers such as poly(para-xylylenes), oxygen should not be used, but rather $N_2$ or a noble gas such as argon should be used.

The gas flow rates should be minimized to reduce the dilution of the reactive intermediates within the deposition chamber. The thickness of the gas blanket can be increased by increasing the gas flow rate. For deposition chambers of a typical size used in the manufacture of semiconductor thin films, gas flow rates are in the range of from about 2 liters/min. to about 100 liters/min., preferably from about 5 liters/min to about 15 liters/min, and more preferably about 10 liters/min. The pressure gradient across the porous panel necessary depends on the density and viscosity of the blanket gas. For example, Ar has a higher density than He, and therefore requires a higher pressure gradient to generate the desired flow of blanket gas.

While the present invention has been described with reference to the alternative embodiments described above, those embodiments are offered by way of example, not by way of limitation. Those of ordinary skill in the art will be enabled by this disclosure to add to or modify the embodiments of the present invention in various obvious ways. Accordingly, such modifications and additions are deemed to lie within the spirit and scope of the invention as set out in the appended claims.

What is claimed is:

1. A chamber for chemical vapor deposition or transport polymerization, comprising:
   a dispersion head comprising at least one plate of an array of gas separator plates, cooling plates, and gas injector plates within a stream of deposition gas and comprising a curved surface without a sharp edge,
   a chuck adapted to hold a semiconductor wafer, and
   an enclosure containing said dispersion head.

2. A gas separator plate used for chemical vapor deposition with a curved top portion, without a sharp edge, within a stream of gas containing precursors for a semiconductor thin film.

3. The gas separator plate of claim 2 with a shaped top face having at least one curved portion and a flat portion, wherein said gas separator plate is within the flow of a deposition gas.

4. The gas separator plate of claim 2 with a top portion having at least a curved edge.

5. The gas separator plate of claim 2 with a shaped top portion having a convex shape.

6. The gas separator plate of claim 5, wherein the shape of at least a portion of the top face is selected from the group consisting of hemicylindrical, ellipsoidal, and parabolic.

7. The gas separator plate of claim 4, wherein the shape of at least part of a top portion of said gas separator plate has a convex-concave shape.

8. An array of gas separator plates for chemical vapor deposition or transport polymerization, at least one of said plates having a curved surface without a sharp edge, and wherein the spaces between said plates are sufficiently wide to maintain laminar flow of a deposition gas between said gas separator plates.

9. The array of claim 8, wherein the spaces between said plates are sufficiently narrow to maintain deposition gas flow rates above about 1 cm/sec.

10. The array of claim 8, wherein the spaces between said plates is adjustable to regulate the flow of the deposition gas.

11. The array of claim 8, wherein the distance between the top portions of said gas separator plates and a semiconductor wafer are separately adjustable to regulate the flow of a deposition gas.

12. The array of claim 8, wherein the top portion of at least one of said gas separator plates has a curved shape.

13. A gas dispersion head comprising a gas inlet port, an exhaust port and an array of the gas separation plates of claim 8 having curved surfaces without sharp edges.

14. The gas dispersion head of claim 13, wherein at least one of said gas separation plates comprises a curved top portion.

15. The deposition chamber of claim 1, further comprising a porous membrane disposed between said array of gas separator plates and said chuck.

16. The porous membrane of claim 15 made from a material selected from the group consisting of stainless steel, ceramic, glass, and organic polymer material.

17. The porous membrane of claim 15, comprising pores with diameters in the range of about 0.1 $\mu$m to about 500 $\mu$m.

18. The porous membrane of claim 15, comprising pores with diameters in the range of about 0.2 $\mu$m to about 20 $\mu$m.

19. The porous membrane of claim 15, comprising pores with diameters of about 0.5 $\mu$m.

20. The chamber of claim 1, wherein all surfaces exposed to gas flow are curved.

21. The chamber of claim 1, wherein aerodynamic gas flow profiles of chamber elements are adjusted to reduce gas residence time.

22. A semiconductor wafer processing reactor, comprising:
   a dispersion head comprising at least one of an array of gas separator plates, cooling plates, and gas injector plates, wherein at least a portion of at least one of said gas separator plates, cooling plates and gas injector plates is within a stream of deposition gas, and comprises a curved surface without a sharp edge
   a chuck adapted to hold a semiconductor wafer, and
   an enclosure containing said dispersion head.

23. The array of claim 8, wherein the spaces are sufficiently wide so that the Reynold's number is below about 10,000.

24. The array of claim 8, wherein the spaces are sufficiently wide so that the Reynold's number is below about 1000.

25. The array of claim 8, wherein the spaces are sufficiently wide so as to produce a linear velocity of deposition gas of at least 0.2 cm/sec.

26. A chamber for chemical vapor deposition or transport polymerization, comprising:
   a dispersion head comprising at least one plate of an array of gas separator plates, cooling plates, and gas injector plates, wherein at least a portion of said plates within a stream of deposition gas comprises a convex-concave shape without a sharp edge,
   a chuck adapted to hold a semiconductor wafer, and
   an enclosure containing said dispersion head.

27. An array of gas separator plates for chemical vapor deposition or transport polymerization, at least one of said plates having a curved surface without a sharp edge, and wherein the spaces between said plates are sufficiently wide to maintain laminar flow of a deposition gas between said gas separator plates, and wherein the distance between the top portions of said gas separator plates and a semiconductor wafer are separately adjustable to regulate the flow of a deposition gas.

28. A chamber for chemical vapor deposition or transport polymerization, comprising:
   a dispersion head comprising at least one plate of an array of gas separator plates, cooling plates, and gas injector plates, said plate within a stream of deposition gas and comprising a curved surface without a discontinuity;
   a chuck adapted to hold a semiconductor wafer, and
   an enclosure containing said dispersion head.

29. A chamber for chemical vapor deposition or transport polymerization, comprising:
   a dispersion head comprising at least one plate of an array of gas separator plates, cooling plates, and gas injector plates, said plate within a stream of deposition gas and comprising sidewalls and a top portion comprising a continuously curved surface that merges into said sidewalls;

a chuck adapted to hold a semiconductor wafer, and an enclosure containing said dispersion head.

* * * * *